(12) United States Patent
Chen et al.

(10) Patent No.: US 12,283,606 B2
(45) Date of Patent: Apr. 22, 2025

(54) LIGHT-EMITTING DEVICE

(71) Applicant: EPISTAR CORPORATION, Hsinchu (TW)

(72) Inventors: Chao-Hsing Chen, Hsinchu (TW); I-Lun Ma, Hsinchu (TW); Bo-Jiun Hu, Hsinchu (TW); Yu-Ling Lin, Hsinchu (TW); Chien-Chih Liao, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 18/442,843

(22) Filed: Feb. 15, 2024

(65) Prior Publication Data

US 2024/0194724 A1 Jun. 13, 2024

Related U.S. Application Data

(63) Continuation of application No. 17/348,080, filed on Jun. 15, 2021, now Pat. No. 11,942,509, which is a
(Continued)

(30) Foreign Application Priority Data

Jul. 12, 2018 (TW) .................................. 107124067

(51) Int. Cl.
*H01L 27/15* (2006.01)
*H01L 33/24* (2010.01)
(Continued)

(52) U.S. Cl.
CPC ............ *H01L 27/156* (2013.01); *H01L 33/24* (2013.01); *H01L 33/385* (2013.01);
(Continued)

(58) Field of Classification Search
CPC ............... H01L 27/156; H01L 33/0075; H01L 33/0093; H01L 33/12; H01L 33/24;
(Continued)

(56) References Cited

U.S. PATENT DOCUMENTS

2009/0134420 A1* 5/2009 Nagai ................. H01L 25/0753
438/33
2012/0074441 A1* 3/2012 Seo ......................... H01L 33/42
257/E33.068
(Continued)

FOREIGN PATENT DOCUMENTS

KR 20180073866 A 7/2018

*Primary Examiner* — Omar F Mojaddedi
(74) *Attorney, Agent, or Firm* — MUNCY, GEISSLER, OLDS & LOWE, P.C.

(57) ABSTRACT

A light-emitting device comprises a substrate; a first light-emitting unit and a second light-emitting unit formed on the substrate, each of the first light-emitting unit and the second light-emitting unit comprises a first semiconductor layer, a second semiconductor layer, and an active layer between the first semiconductor layer and the second semiconductor layer, wherein the first light-emitting unit comprises a first semiconductor mesa and a first surrounding part surrounding the first semiconductor mesa, and the second light-emitting unit comprises a second semiconductor mesa and a second surrounding part surrounding the second semiconductor mesa; a trench formed between the first light-emitting unit and the second light-emitting unit and exposing the substrate; a first insulating layer comprising a first opening on the first surrounding part and a second opening on the second semiconductor layer of the second light-emitting unit; and a connecting electrode comprising a first connecting part on the first light-emitting unit and connected to the first semiconductor layer formed in the first opening, a second connecting part on the second light-emitting unit and connected to the second semiconductor layer of the second
(Continued)

light-emitting unit, and a third connecting part formed in the trench to connect the first connecting part and the second connecting part.

20 Claims, 17 Drawing Sheets

Related U.S. Application Data continuation of application No. 16/510,388, filed on Jul. 12, 2019, now Pat. No. 11,063,087.

(51) Int. Cl.
| | | |
|---|---|---|
| *H01L 33/38* | (2010.01) | |
| *H01L 33/46* | (2010.01) | |
| *H01L 33/62* | (2010.01) | |
| *H01L 33/00* | (2010.01) | |
| *H01L 33/12* | (2010.01) | |
| *H01L 33/30* | (2010.01) | |
| *H01L 33/42* | (2010.01) | |

(52) U.S. Cl.
CPC ...... *H01L 33/0075* (2013.01); *H01L 33/0093* (2020.05); *H01L 33/12* (2013.01); *H01L 33/30* (2013.01); *H01L 33/42* (2013.01); *H01L 33/46* (2013.01); *H01L 33/62* (2013.01); *H01L 2933/0016* (2013.01)

(58) Field of Classification Search
CPC ....... H01L 33/30; H01L 33/385; H01L 33/42; H01L 33/46; H01L 33/62
See application file for complete search history.

(56) References Cited

U.S. PATENT DOCUMENTS

| | | | |
|---|---|---|---|
| 2014/0209955 A1* | 7/2014 | Kim | ........................ H01L 33/62 257/99 |
| 2014/0312369 A1* | 10/2014 | Yoon | ....................... H01L 33/44 257/96 |
| 2016/0087149 A1* | 3/2016 | Miyachi | .................. H01L 33/56 362/509 |
| 2016/0211410 A1* | 7/2016 | Jang | ....................... H01L 27/153 |
| 2017/0108173 A1* | 4/2017 | Kim | .................... H01L 33/0033 |
| 2020/0194628 A1* | 6/2020 | Seo | ........................ H01L 33/38 |
| 2020/0258936 A1* | 8/2020 | Jang | ...................... H01L 33/382 |

* cited by examiner

FIG. 2 A-A'

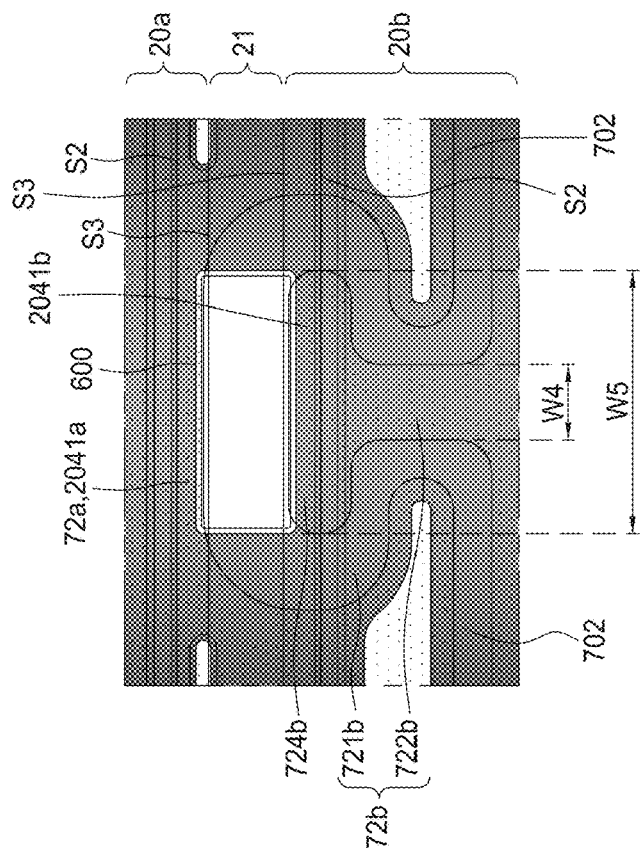
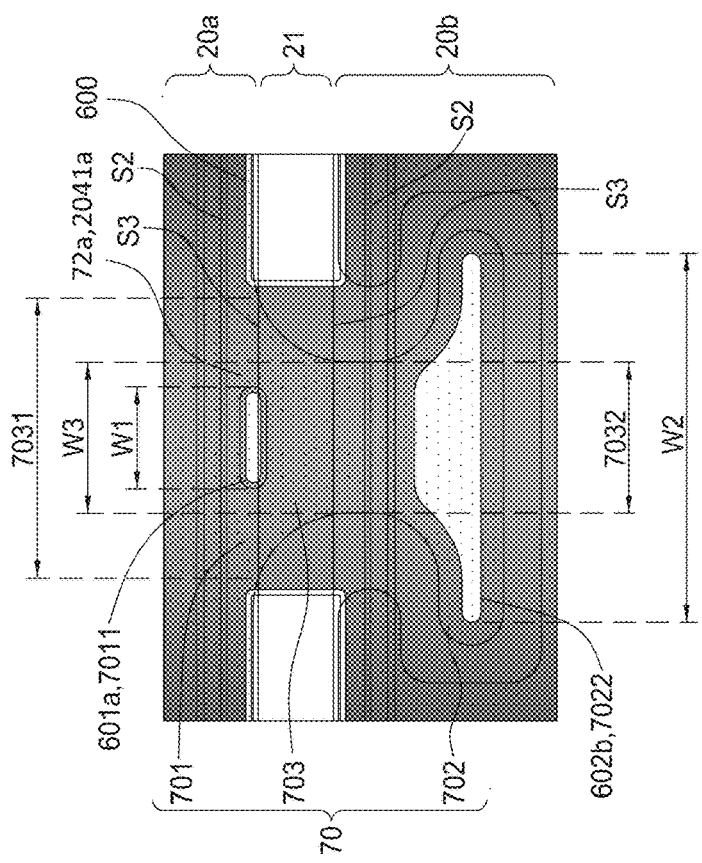
FIG. 7B
FIG. 7A

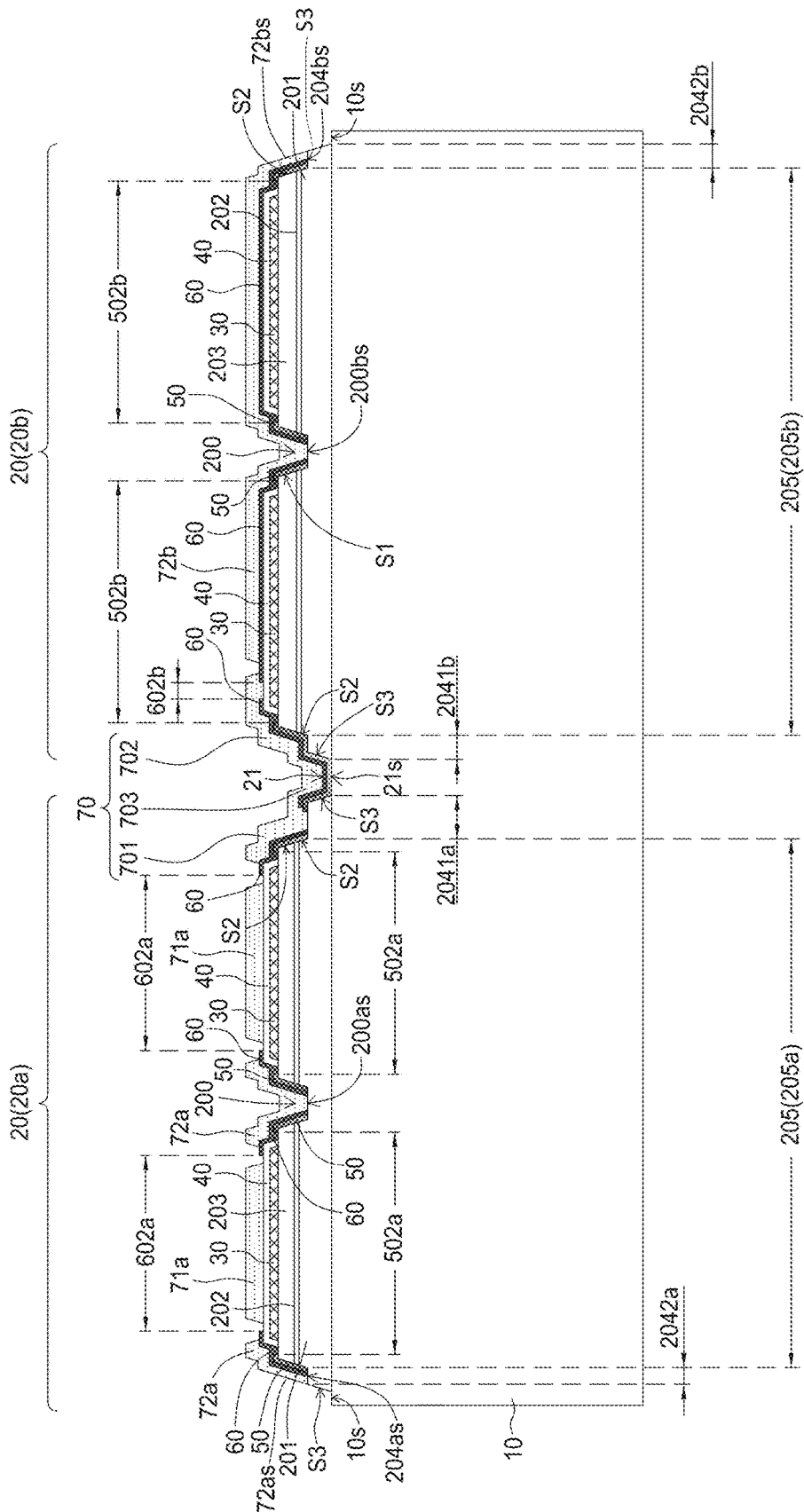
FIG. 8  A-A'

B-B'

LIGHT-EMITTING DEVICE

REFERENCE TO RELATED APPLICATION

This application is a continuation application of U.S. patent application Ser. No. 17/348,080, filed on Jun. 15, 2021, now pending, which is a continuation application of U.S. patent application Ser. No. 16/510,388, filed on Jul. 12, 2019, now U.S. Pat. No. 11,063,087, which claims the right of priority based on TW Application Serial No. 107124067, filed on Jul. 12, 2018, and the content of which is hereby incorporated by reference in its entirety.

TECHNICAL FIELD

The application relates to a light-emitting device, and more particularly, to a light-emitting device comprising a plurality of light-emitting units and a connecting electrode formed between the plurality of light-emitting units.

DESCRIPTION OF BACKGROUND ART

Light-Emitting Diode (LED) is a solid-state semiconductor light-emitting device, which has the advantages of low power consumption, low heat generation, long working lifetime, shockproof, small volume, fast reaction speed and good photoelectric property, such as stable emission wavelength. Therefore, light-emitting diodes are widely used in household appliances, equipment indicators, and optoelectronic products.

SUMMARY OF THE APPLICATION

A light-emitting device comprises a substrate; a first light-emitting unit and a second light-emitting unit formed on the substrate, each of the first light-emitting unit and the second light-emitting unit comprises a first semiconductor layer, a second semiconductor layer, and an active layer between the first semiconductor layer and the second semiconductor layer, wherein the first light-emitting unit comprises a first semiconductor mesa and a first surrounding part surrounding the first semiconductor mesa, and the second light-emitting unit comprises a second semiconductor mesa and a second surrounding part surrounding the second semiconductor mesa; a trench formed between the first light-emitting unit and the second light-emitting unit and exposing the substrate; a first insulating layer comprising a first opening on the first surrounding part and a second opening on the second semiconductor layer of the second light-emitting unit; and a connecting electrode comprising a first connecting part formed on the first light-emitting unit and connected to the first semiconductor layer formed in the first opening, a second connecting part formed on the second light-emitting unit and connected to the second semiconductor layer of the second light-emitting unit, and a third connecting part formed in the trench to connect the first connecting part and the second connecting part.

A light-emitting device comprises a substrate; a first light-emitting unit and a second light-emitting unit formed on the substrate, each of the first light-emitting unit and the second light-emitting unit comprises a first semiconductor layer, a second semiconductor layer, and an active layer between the first semiconductor layer and the second semiconductor layer, wherein the first light-emitting unit comprises a first semiconductor mesa and a first surrounding part surrounding the first semiconductor mesa, and the second light-emitting unit comprises a second semiconductor mesa and a second surrounding part surrounding the second semiconductor mesa; a trench formed between the first light-emitting unit and the second light-emitting unit, and exposing the substrate; a connecting electrode comprising a first connecting part formed on the first light-emitting unit and connected to the first semiconductor layer of the first light-emitting unit, a second connecting part formed on the second light-emitting unit and connected to the second semiconductor layer of the second light-emitting unit, and a third connecting part formed in the trench to connect the first connecting part and the second connecting part; and an insulating layer comprising a first opening below the first connecting part and a second opening below the second connecting part, wherein the second opening comprises an opening area larger than that of the first opening in a top view of the light-emitting device.

A light-emitting device comprises a substrate; a first light-emitting unit and a second light-emitting unit formed on the substrate, each of the first light-emitting unit and the second light-emitting unit comprises a first semiconductor layer, a second semiconductor layer, and an active layer between the first semiconductor layer and the second semiconductor layer, wherein the first light-emitting unit comprises a first semiconductor mesa and a first surrounding part surrounding the first semiconductor mesa, and the second light-emitting unit comprises a second semiconductor mesa and a second surrounding part surrounding the second semiconductor mesa; a trench formed between the first light-emitting unit and the second light-emitting unit, and exposing the substrate; a first inner recess formed on the first light-emitting unit and exposing the first semiconductor layer of the first light-emitting unit; a second inner recess formed on the second light-emitting unit and exposing the first semiconductor layer of the second light-emitting unit, wherein the first inner recess and the second inner recess are formed on opposite sides of the trench; a connecting electrode comprising a first connecting part formed on the first inner recess and contacting the first semiconductor layer of the first light-emitting unit, a second connecting part formed on the second inner recess and electrically connected to the second semiconductor layer of the second light-emitting unit, and a third connecting part formed in the trench to connect the first connecting part and the second connecting part; and an insulating layer covering the first semiconductor layer of the second inner recess and formed below the second connecting part.

A light-emitting device comprises a substrate; a first light-emitting unit and a second light-emitting unit formed on the substrate, each of the first light-emitting unit and the second light-emitting unit comprises a first semiconductor layer, a second semiconductor layer, and an active layer between the first semiconductor layer and the second semiconductor layer; a trench formed between the first light-emitting unit and the second light-emitting unit, and exposing the substrate; a first surrounding part formed on the first light-emitting unit and exposing the first semiconductor layer of the first light-emitting unit; a second surrounding part formed on the second light-emitting unit and exposing the first semiconductor layer of the second light-emitting unit; a plurality of connecting electrodes formed between the first light-emitting unit and the second light-emitting unit, each comprising a first connecting part formed on the first surrounding part and contacting the first semiconductor layer of the first light-emitting unit, a second connecting part formed on the second surrounding part and electrically connected to the second semiconductor layer of the second light-emitting unit, and a third connecting part formed in the trench to connect the first connecting part and the second connecting part; a first bottom electrode formed on the first surrounding part and contacting the first semiconductor layer of the first light-emitting unit; and a plurality of second bottom electrode projecting portions formed on the second surrounding part and contacting the first semiconductor layer of the second light-emitting unit, wherein the plurality of connecting electrodes and the plurality of second bottom electrode projecting portions are alternately arranged.

BRIEF DESCRIPTION OF THE DRAWINGS

FIG. 7A illustrates a partial enlarged view of FIG. 7;

FIG. 7B illustrates a partial enlarged view of FIG. 7;

FIG. 8 illustrates a cross-sectional view taken along line A-A' of FIG. 7;

DETAILED DESCRIPTION OF PREFERRED EMBODIMENTS

Figure 1:
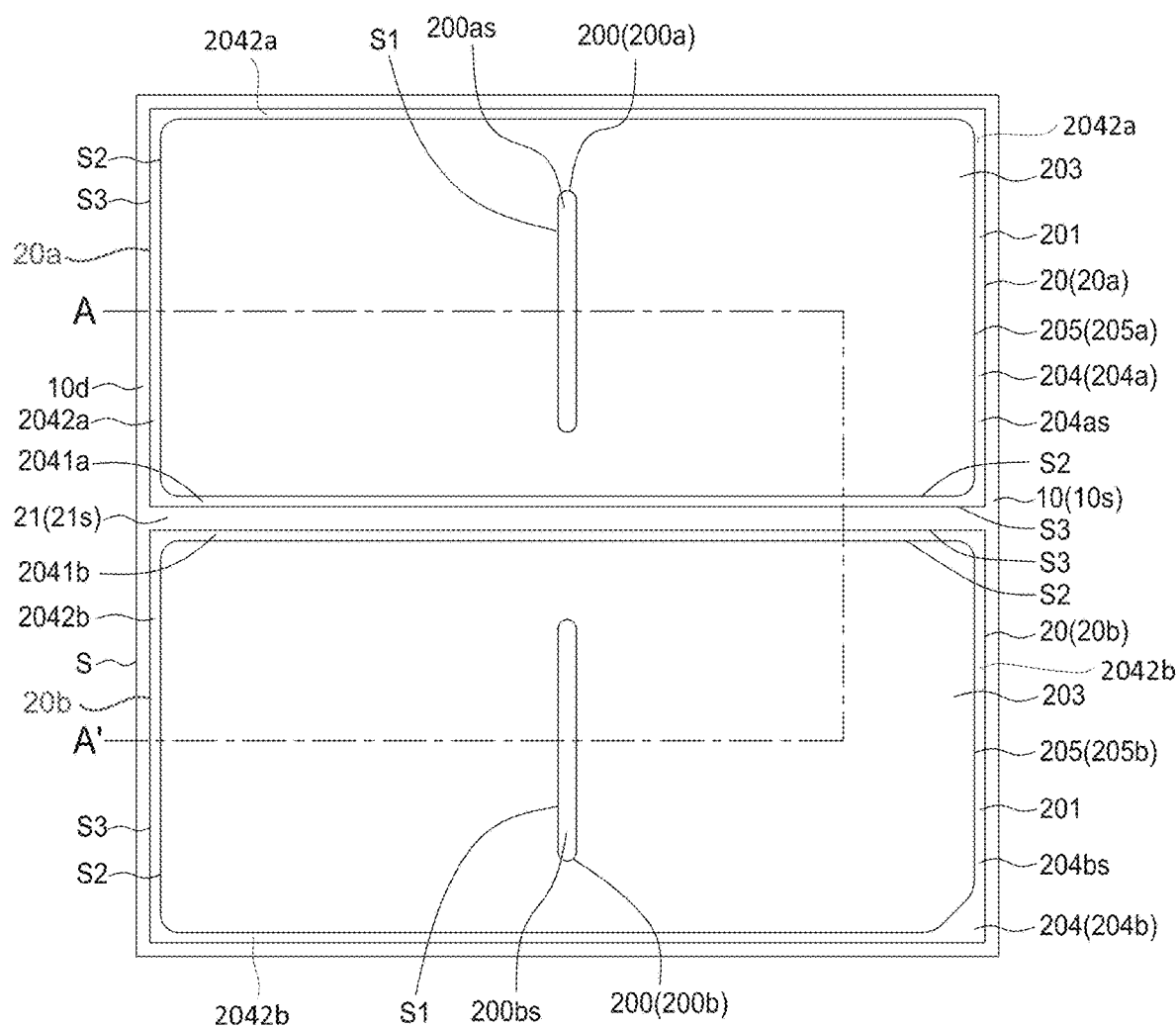
FIG. 1 illustrates a top view showing a trench and a via formed in a semiconductor stack in accordance with an embodiment of the present application.

The embodiment of the application is illustrated in detail, and is plotted in the drawings. The same or the similar part is illustrated in the drawings and the specification with the same number.

Figure 2:
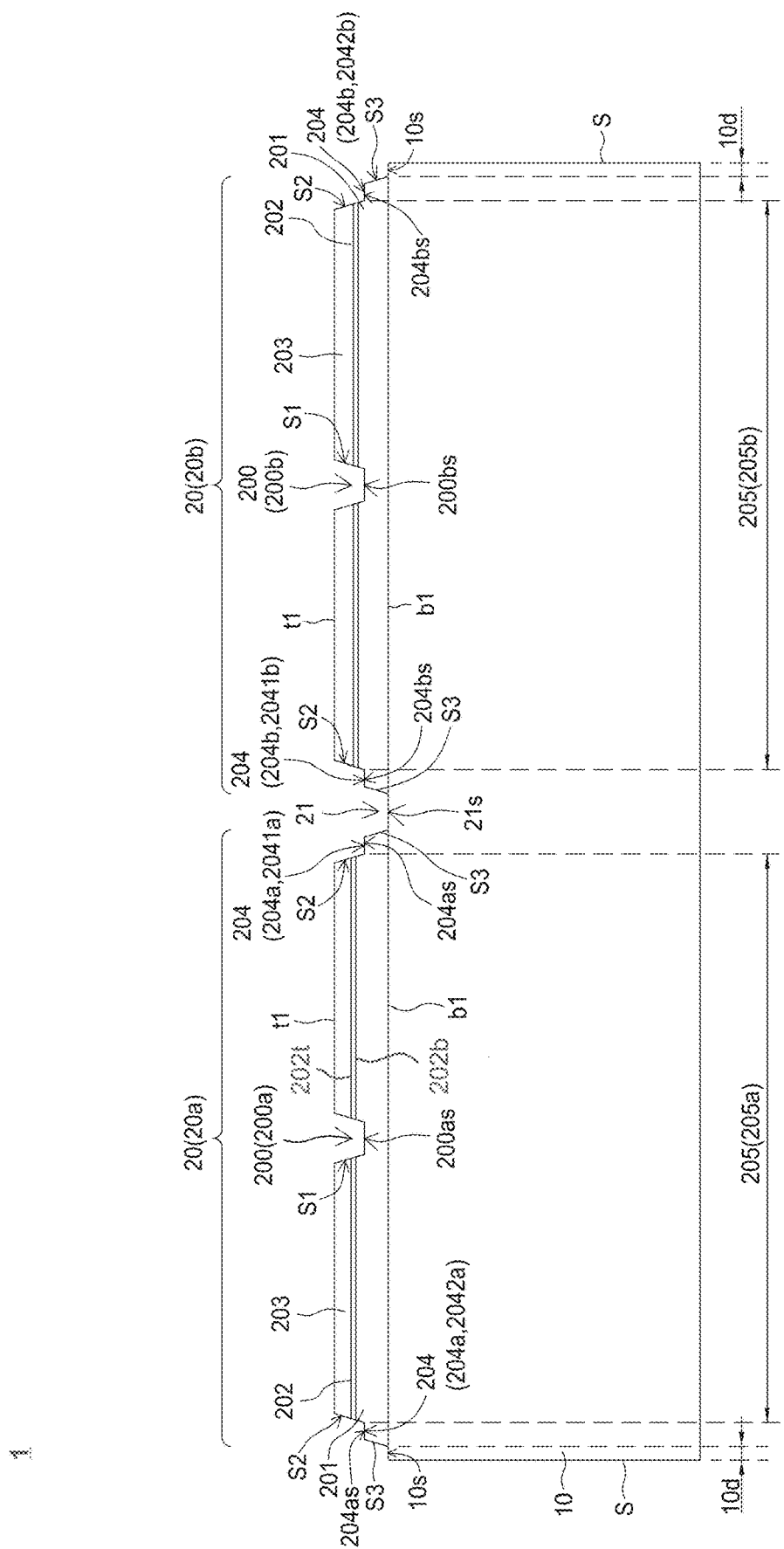
FIG. 2 illustrates a cross-sectional view taken along line A-A' of FIG. 1.

FIG. 1 illustrates a top view showing a trench and a via formed in a semiconductor stack in accordance with an embodiment of the present application. FIG. 2 illustrates a cross-sectional view taken along line A-A' of FIG. 1. The semiconductor stack comprises a first semiconductor layer 201, an active layer 202 and a second semiconductor layer 203 sequentially formed on a surface of a substrate 10. One or a plurality of trenches 21 penetrates the second semiconductor layer 203, the active layer 202, and the first semiconductor layer 201 to expose a surface 21s of the substrate 10, and divides the semiconductor stack into a plurality of light-emitting units 20, wherein the plurality of light-emitting units 20 is separated from each other by the trench 21.

In an embodiment of the present application, as shown in FIG. 1 and FIG. 2, the light-emitting device 1 comprises a first light-emitting unit 20a and a second light-emitting unit 20b, wherein the first light-emitting unit 20a and the second light-emitting unit 20b are separated by the trench 21, and the surface 21s of the substrate 10 is exposed.

In an embodiment of the present application (not shown), the light-emitting device 1 comprises a plurality of light-emitting units 20 arranged in an array having a rectangular shape, the plurality of light-emitting units 20 is separated from each other by a plurality of trenches 21, wherein the plurality of light-emitting units 20 comprises same area and/or same shape, or different areas and/or different shapes, and the trenches 21 are connected to each other and continuously expose the surface 21s of the substrate 10.

In an embodiment of the present application, in the top view of the light-emitting device 1, the light-emitting device 1 comprises a polygonal shape such as a triangular shape, a hexagonal shape, a rectangular shape or a square shape. As shown in FIG. 1, the light-emitting device 1 having the square shape is illustrated in the embodiment. The light-emitting device 1 comprises a substrate 10 having a plurality of outer sidewalls S located around the light-emitting device 1 to form a polygonal shape such as a triangular shape, a hexagonal shape, a rectangular shape or a square shape. The size of the light-emitting device 1 may be, for example, a square shape of 1000 μm*1000 μm or 700 μm*700 μm, or a rectangular shape of a similar size, but is not particularly limited thereto.

The substrate 10 can be a growth substrate, comprising gallium arsenide (GaAs) wafer for growing aluminum gallium indium phosphide (AlGaInP), or sapphire ($Al_2O_3$) wafer, gallium nitride (GaN) wafer or silicon carbide (SiC) wafer for growing gallium nitride (GaN), indium gallium nitride (InGaN) or aluminum gallium nitride (AlGaN). In another embodiment, the substrate 10 can be a support substrate, the semiconductor stack which was originally epitaxially grown on the growth substrate can be transferred to the support substrate, and the growth substrate originally used for epitaxial growth is optionally removed according to the requirements of the application.

The support substrate comprises a conductive material such as silicon (Si), aluminum (Al), copper (Cu), tungsten (W), molybdenum (Mo), gold (Au), silver (Ag), silicon carbide (SiC) or an alloy of the above materials, or a thermally conductive material such as diamond, graphite or aluminum nitride. Although the feature is omitted in the figures, the side of the substrate 10 that is in contact with the semiconductor stack comprises a rough surface, and the rough surface comprises a surface having an irregular morphology or a surface having a regular morphology, for example, the surface having a plurality of hemispheres, the surface having a plurality of cones, or the surface having a plurality of pyramids.

In an embodiment of the present application, a plurality of semiconductor layers comprising optical characteristics and semiconductor materials is formed on the substrate 10 by organic metal chemical vapor deposition (MOCVD), molecular beam epitaxy (MBE), hydride vapor deposition (HVPE), physical vapor deposition (PVD), or ion plating, wherein physical vapor deposition (PVD) comprises sputtering or evaporation.

In an embodiment of the present application, the semiconductor stack comprises a buffer layer (not shown) formed between the first semiconductor layer 201 and the substrate 10 which can release the stress caused by lattice mismatch between the materials of the substrate 10 and the first semiconductor layer 201 so the lattice dislocation and the lattice defect are reduced and the epitaxial quality of the semiconductor stack is improved. The buffer layer comprises a single layer or a structure comprising a plurality of layers. In an embodiment, an aluminum nitride (AlN) layer formed by using PVD method can be the buffer layer formed between the first semiconductor layer 201 and the substrate 10 to improve the epitaxial quality of the semiconductor stack. In an embodiment, the method for forming aluminum nitride (AlN) is PVD, and the target is made of aluminum nitride. In another embodiment, a target made of aluminum reacts with a nitrogen source to form the aluminum nitride.

The wavelength of the light emitted from the light-emitting device 1 is adjusted by changing the physical and chemical composition of one or more layers in the semiconductor stack. The material of the semiconductor stack comprises a group III-V semiconductor material, such as $Al_xIn_yGa_{(1-x-y)}N$ or $Al_xIn_yGa_{(1-x-y)}P$, wherein $0 \leq x$, $y \leq 1$; $(x+y) \leq 1$. According to the material of the active layer 202, when the material of the semiconductor stack comprises AlInGaP series material, red light having a wavelength between 610 nm and 650 nm or yellow light having a wavelength between 550 nm and 570 nm can be emitted. When the material of the semiconductor stack comprises InGaN series material, blue or deep blue light having a wavelength between 400 nm and 490 nm or green light having a wavelength between 490 nm and 550 nm can be emitted. When the material of the semiconductor stack comprises AlGaN series material, UV light having a wavelength between 400 nm and 250 nm can be emitted.

The first semiconductor layer 201 and the second semiconductor layer 203 can be cladding layers, have different conductivity types, electrical properties, polarities, or doping elements for providing electrons or holes. For example, the first semiconductor layer 201 is an n-type semiconductor and the second semiconductor layer 203 is a p-type semiconductor. The active layer 202 is formed between the first semiconductor layer 201 and the second semiconductor layer 203. The electrons and holes combine in the active layer 202 under a current driving to convert electric energy into light energy and then light is emitted from the active layer 202. The active layer 202 can be a single heterostructure (SH), a double heterostructure (DH), a double-side double heterostructure (DDH), or a multi-quantum well structure (MQW). The material of the active layer 123 can be i-type, p-type, or n-type semiconductor. The first semiconductor layer 201, the active layer 202, or the second semiconductor layer 203 can be a single layer or a structure comprising a plurality of layers.

As shown in FIG. 2, each of the light-emitting units 20 is selectively etched to form one or a plurality of vias 200, one or a plurality of surrounding parts 204, and one or a plurality of semiconductor mesas 205 on each of the light-emitting units 20. The semiconductor mesa 205 of each of the light-emitting units 20 is surrounded by one or the plurality of surrounding parts 204. For example, after coating a photoresist and removing a portion of the photoresist, a photoresist pattern of the via 200, the surrounding part 204 and the semiconductor mesa 205 is formed through a lithography process. Then, an etching process is provided to form the via 200, the surrounding part 204 and the semiconductor mesa 205 by using the photoresist pattern as an etching mask. Specifically, each semiconductor mesa 205 is formed by removing a portion of the second semiconductor layer 203 and the active layer 202 to form a structure comprising the first semiconductor layer 201, the active layer 202 and the second semiconductor layer 203. Each of the vias 200 and the surrounding parts 204 is formed by removing a portion of the second semiconductor layer 203 and the active layer 202 to expose the first semiconductor layer 201. The remaining photoresist pattern is removed after the etching process. In other words, the semiconductor mesa 205 comprises the first semiconductor layer 201, the active layer 202, and the second semiconductor layer 203. The via 200 and the surrounding part 204 expose the first semiconductor layer 201. The via 200 and the surrounding part 204 do not comprise the second semiconductor layer 203 and the active layer 202 formed thereon, As shown in FIG. 2, each of the semiconductor mesas 205 comprises an upper surface t1 and a lower surface b1. The active layer 202 comprises a first upper surface 202t and a second lower surface 202b, wherein the first upper surface 202t of the active layer 202 is closer to the upper surface t1 of the semiconductor mesa 205 than the second lower surface 202b of the active layer 202 to the upper surface t1 of the semiconductor mesa 205. A first distance is between the upper surface t1 of the semiconductor mesa 205 and the first upper surface 202t of the active layer 202, a second distance is between the lower surface b1 of the semiconductor mesa 205 and the second lower surface 202b of the active layer 202, and the second distance is greater than the first distance.

In an embodiment of the present application, when the growth substrate is removed from the semiconductor stack and the semiconductor stack is flipped to be mounted to the support substrate, each semiconductor mesa 205 comprises an upper surface t1 and a lower surface b1. The active layer 202 comprises a first upper surface 202t and a second lower surface 202b, wherein the upper surface t1 of the semiconductor mesa 205 and the first upper surface 202t of the active layer 202 are respectively away from the support substrate than the lower surface b1 of the semiconductor mesa 205 and the second lower surface 202b of the active layer 202 to the support substrate. A first distance is between the upper surface t1 of the semiconductor mesa 205 and the first upper surface 202t of the active layer 202, a second distance is between the lower surface b1 of the semiconductor mesa 205 and the second lower surface 202b of the active layer 202, and the first distance is greater than the second distance.

In a top view of the light-emitting device 1, as shown in FIG. 1, the shape(s) of one or the plurality of the vias 200 can be an ellipse, a circle, a rectangle, or any other shape.

In an embodiment of the present application, as shown in FIG. 1, each of the light-emitting units 20 comprises only one surrounding part 204. In an embodiment, the surrounding part 204 is located at an outermost side of each of the light-emitting units 20 and continuously surrounds the light-emitting unit 20. The outermost side of the light-emitting unit 20 comprises the surround part 204 circumferentially surrounding the light-emitting unit 20. In a top view of the light-emitting device 1, the shape of the surrounding part 204 comprises a polygon, such as a triangle, a hexagon, a rectangle, or any other shape. In other words, the shape of the surrounding part 204 corresponds to the shape of each of the light-emitting units 20. The shape of each surrounding part 204 is similar to the shape of each of the light-emitting units 20. In an embodiment, the shape of the surrounding part 204 comprises a rectangle, the shape of each of the light-emitting units 20 comprises a rectangle, and the surrounding part 204 is located at the outermost side of each of the light-emitting units 20, wherein the corners of the rectangular light-emitting unit 20 can be rounded to avoid current crowding at the corners of each of the light-emitting units 20. The surrounding part 204 continuously surrounds the second semiconductor layer 203 and the active layer 202 of each of the light-emitting units 20 by exposing the surface of the first semiconductor layer 201 at the outermost side of each of the light-emitting unit 20.

In another embodiment (not shown), in the top view of the light-emitting device 1, the semiconductor mesa 205 comprises a wave shape, a zigzag shape or a square wave shape. Each of the light-emitting units 20 respectively comprises a plurality of surrounding parts 204. The top view shape of each of the plurality of surrounding parts 204 comprises a rectangle, an ellipse or a circle, and the plurality of surrounding parts 204 is located at the outermost sides of each of the light-emitting units 20 to discontinuously surround the second semiconductor layer 203 and the active layer 202 of the semiconductor mesa 205. The position of the plurality of surrounding parts 204a is formed close to the concave part of the wave shape, the zigzag shape or the square wave shape. In order to avoid the electrical current locally crowding at the corner of the light-emitting unit 20, the semiconductor stack comprising the second semiconductor layer 203 and the active layer 202 located at the corner of the light-emitting unit 20 are remained without being removed. The plurality of surrounding parts 204 are formed on the plurality of sides of each of the light-emitting units 20 by removing the second semiconductor layer 203 and the active layer 202 on the plurality of sides of each of the light-emitting units 20. One or more surrounding parts 204 are located on one of the plurality of sides of each of the light-emitting units 20. The number of surrounding parts 204 formed on one side of the plurality of sides may be the same or different from the number of surrounding parts 204 formed on the other side of the plurality of sides of each of the light-emitting units 20. Taking one of the light-emitting units 20 as an example, the light-emitting unit 20 comprises one or more surrounding parts 204 formed on one side, and one or more surrounding parts 204 formed on the adjacent side or the opposite side, the number of surrounding parts 204 on the one side and the adjacent side may be the same or different, or the number of surrounding parts 204 on the one side and the opposite side may be the same or different.

As shown in FIG. 1, one or more vias 200 are located inside each of the light-emitting units 20 and are surrounded by one or the plurality of surrounding parts 204. In other words, one or more vias 200 are respectively surrounded by the second semiconductor layer 203 and the active layer 202 of each of the light-emitting units 20.

The number and arrangement positions of the plurality of vias 200 are not limited, and that may be regularly arranged at a certain interval to uniformly spread the current in the horizontal direction. The plurality of vias 200 may be arranged in a plurality of columns, and the vias 200 of any adjacent two columns may be aligned or staggered from each other. The position of the contact layer and the electrode subsequently formed can be determined according to the arrangement position of the plurality of vias 200.

In an embodiment of the present application, the vias 200 on the adjacent two columns are staggered from each other, and a distance between the vias 200 of the adjacent two columns is the same as a distance between the vias 200 of the same column so that the plurality of vias 200 is closely arranged to uniformly spread the current.

In an embodiment of the present application, considering the position of the contact layer and the electrode subsequently formed, the vias 200 of the adjacent two columns are staggered from each other, and a shortest distance between two vias 200 respectively in the adjacent two columns is smaller than a shortest distance between two vias 200 in the same column.

In an embodiment of the present application, considering the position of the contact layer and the electrode subsequently formed, the vias 200 of the adjacent two columns are staggered from each other, and a shortest distance between the vias 200 of the adjacent two columns is larger than a shortest distance between the vias 200 of the same column.

As shown in FIG. 1 and FIG. 2, the first light-emitting unit 20a comprises a first semiconductor mesa 205a. An inner surface 200as of the first semiconductor layer 201 is formed after removing a portion of the second semiconductor layer 203 and the active layer 202. The inner surface 200as of the first semiconductor layer 201 is formed on the one or the plurality of first vias 200a. In the top view of the light-emitting device 1, the plurality of first vias 200a is not connected to each other. A first surrounding part 204a is formed by removing a portion of the second semiconductor layer 203 and the active layer 202 around a plurality of sides of the first semiconductor mesa 205a. An outer surface 204as of the first semiconductor layer 201 is formed after removing the portion of the second semiconductor layer 203 and the active layer 202. The first surrounding part 204a comprises the outer surface 204as of the first semiconductor layer 201. In the top view of the light-emitting device 1, as shown in FIG. 1, the first surrounding part 204a comprises a first inner recess 2041a and a plurality of first outer recesses 2042a. The first inner recess 2041a and the plurality of first outer recesses 2042a are connected to continuously surround the first semiconductor mesa 205a. The first via 200a is formed on the first semiconductor mesa 205a, and the first surrounding part 204a surrounds the first semiconductor mesa 205a.

As shown in FIG. 1 and FIG. 2, the second light-emitting unit 20b comprises a second semiconductor mesa 205b. An inner surface 200bs of the first semiconductor layer 201 is formed after removing a portion of the second semiconductor layer 203 and the active layer 202. The inner surface 200bs of the first semiconductor layer 201 is formed on the one or the plurality of second vias 200b. In the top view of the light-emitting device 1, the plurality of second vias 200b is not connected to each other. A second surrounding part 204b is formed by removing a portion of the second semiconductor layer 203 and the active layer 202 to around a plurality of sides of the second semiconductor mesa 205b. An outer surface 204bs of the first semiconductor layer 201 is formed after removing the portion of the second semiconductor layer 203 and the active layer 202. The second surrounding part 204b comprises the outer surface 204bs of the first semiconductor layer 201. In the top view of the light-emitting device 1, as shown in FIG. 1, the second surrounding part 204b comprises a second inner recess 2041b and a plurality of second outer recesses 2042b. The first inner recess 2041b and the plurality of first outer recesses 2042b are connected to continuously surround the first semiconductor mesa 205b. The second via 200b is formed on the second semiconductor mesa 205b, and the second surrounding part 204b surrounds the second semiconductor mesa 205b.

As shown in FIG. 1 and FIG. 2, the first light-emitting unit 20a and the second light-emitting unit 20b is separated by the trench 21. The trench 21 is between the first inner recess 2041a of the first light-emitting unit 20a and the second inner recess 2041b of the second light-emitting unit 20b.

As shown in FIG. 2, from cross-sectional view, the first via 200a is formed in the first semiconductor mesa 205a, and the first inner recess 2041a and the first outer recess 2042a are respectively formed at two sides of the first semiconductor mesa 205a. The second via 200b is formed in the second semiconductor mesa 205b, and the second inner recess 2041b and the second outer recess 2042b are respectively formed at two sides of the second semiconductor mesa 205b.

The first via 200a and the second via 200b each comprises a first inclined surface S1 having a first angle with respect to a horizontal extension surface of the inner surface 200as or the inner surface 200bs of the first semiconductor layer 201, wherein the first angle is between 10 degrees and 80 degrees. The first surrounding part 204a and the second surrounding part 204b each comprises a second inclined surface S2 having a second angle with respect to a horizontally extension surface of the outer surface 204as or the outer surface 204bs of the first semiconductor layer 201, wherein the second angle is between 10 degrees and 80 degrees. If the first angle or the second angle is less than 10 degrees, an excessively low slope reduces the area of the active layer 202, and a decreased area of the active layer 202 decreases luminance of the light-emitting device. If the first angle or the second angle is greater than 80 degrees, the insulating layer and the metal layer subsequently formed may not completely cover the sidewalls of the first semiconductor layer 201, the second semiconductor layer 203, and/or the active layer 202, thereby causing cracking of the film.

In an embodiment, in order to maintain the symmetry of the structure to reduce the lithography misalignment, the angle difference between the first angle and the second angle is less than 20 degrees, preferably less than 10 degrees, more preferably less than 5 degrees.

In an embodiment, the first semiconductor layer 201 of each of the light-emitting units 20 comprises a third surface S3 having an angle between 10 degrees and 80 degrees with respect to the outer surface 204as or the outer surface 204bs of the first semiconductor layer 201.

In another embodiment, the first semiconductor layer 201 of each of the light-emitting units 20 comprises a third surface S3 having an angle close to 90 degrees with respect to the outer surface 204as or the outer surface 204bs of the first semiconductor layer 201, preferably between 60 degrees and 120 degrees, more preferably between 80 degrees and 110 degrees.

In an embodiment, there is no other surface separating the third surface S3 of the first semiconductor layer 201 and the outer sidewall S of the substrate 10. The outer sidewall S of the substrate 10 may be flush with the third surface S3 of the first semiconductor layer 201, or have an oblique angle with respect to the third surface S3 of the first semiconductor layer 201, preferably an angle between 60 and 120 degrees, more preferably an angle between 80 to 110 degrees.

In another embodiment, as shown in FIG. 2, by removing the first semiconductor layer 201, the second semiconductor layer 202 and the active layer 203, the light-emitting device 1 comprises a dicing street 10d exposing an upper surface 10s of the substrate 10, wherein the first surrounding part 204a is formed between the dicing street 10d and the first semiconductor mesa 205a, and a second surrounding part 204b is formed between the dicing street 10d and the second semiconductor mesa 205b. The third surface S3 has a third angle with respect to the horizontal extension surface of the upper surface 10s of the substrate 10, wherein the third angle is between 10 degrees and 80 degrees, preferably less than 60 degrees, and more preferably less than 40 degrees.

The outer sidewall S of the substrate 10 may be perpendicular to the upper surface 10s exposed by the dicing street 10d, or may have a fourth angle with respect to the upper surface 10s exposed by the dicing street 10d, preferably, the fourth angle is between 60 degrees and 120 degrees, more preferably between 80 degrees and 110 degrees.

In another embodiment, in order to completely cover the third surface S3 with the insulating layer and the metal layer subsequently formed, the difference between the third angle and the second angle is greater than 15 degrees, preferably greater than 25 degrees, more preferably greater than 35 degrees.

In the top view of the light-emitting device 1, a plurality of light-emitting units 20 each comprises a polygon or a rectangle shape, and the plurality of light-emitting units 20 are arranged to form a rectangular array having a plurality of sides. The dicing street 10d surrounds the plurality of sides of the rectangular array formed by the plurality of light-emitting units 20, and continuously exposes the upper surface 10s of the substrate 10.

The dicing street 10d is located at the outermost side of the light-emitting device 1. The top view shape of the dicing street 10d is the same as the shape of the rectangular array arranged by the plurality of light-emitting units 20, for example, a rectangular or polygonal ring shape surrounds the outermost side of the rectangular array arranged by the plurality of light emitting units 20.

In an embodiment, the exposed upper surface 10s of the dicing street 10d is a rough surface. The rough surface may be a surface having an irregular shape or a surface having a regular shape, for example, a surface having a plurality of hemispherical shapes, a surface having a plurality of cones, or a surface having a plurality of pyramids.

Figure 3:
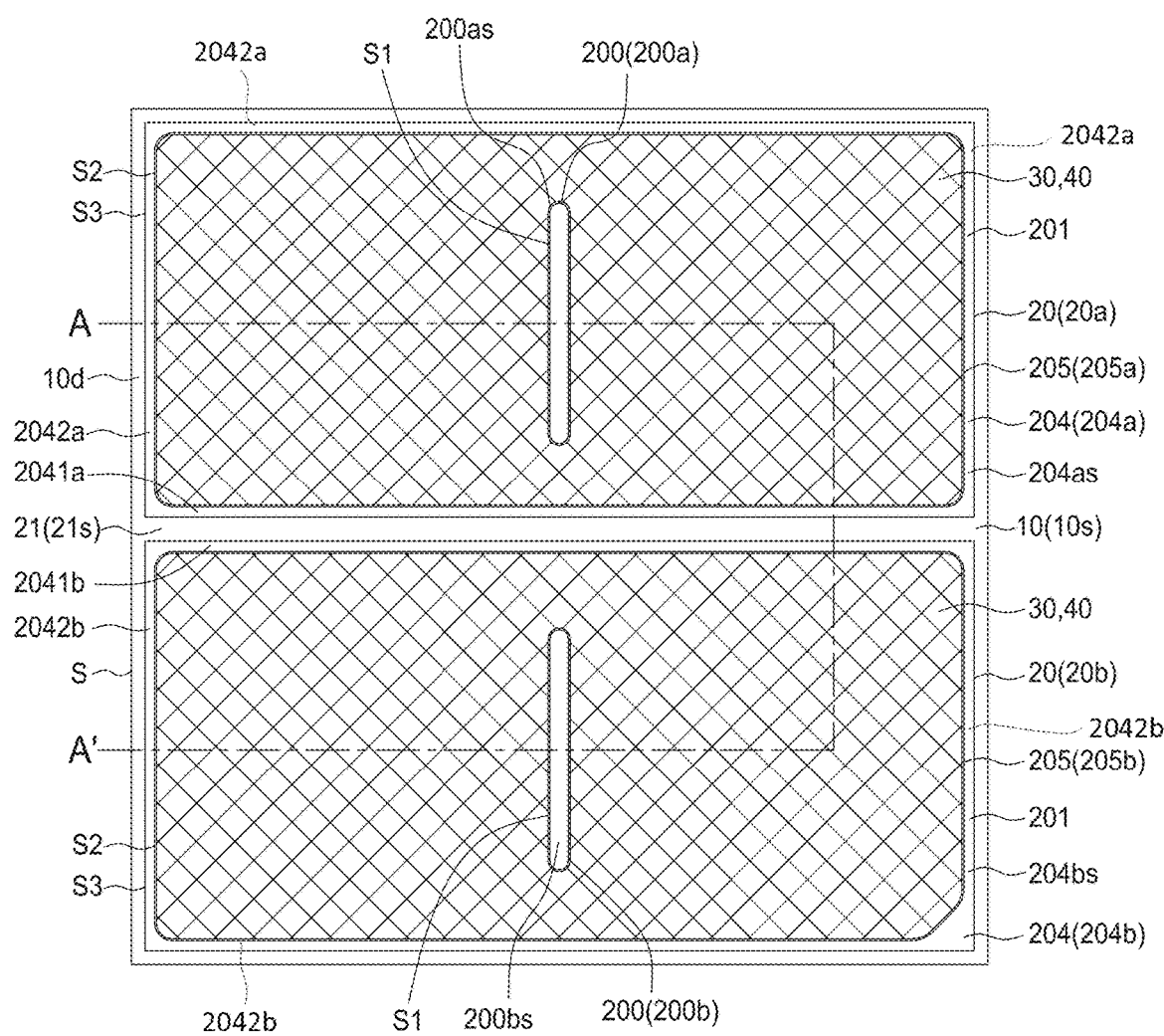
FIG. 3 illustrates a top view showing a contact electrode and a reflective layer formed on the semiconductor stack in accordance with an embodiment of the present application.
Figure 4:
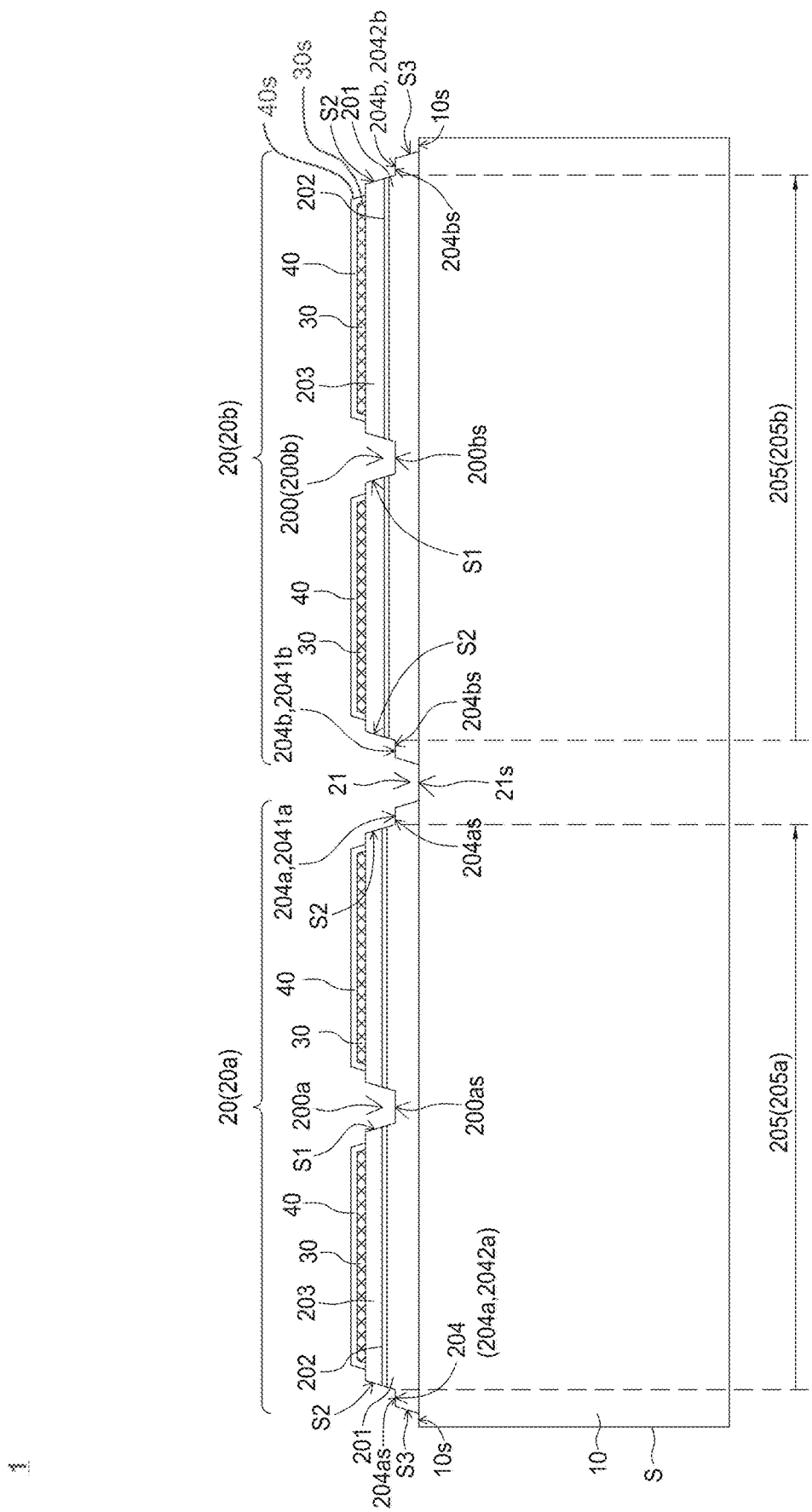
FIG. 4 illustrates a cross-sectional view taken along line A-A' of FIG. 3.
Figure 5:
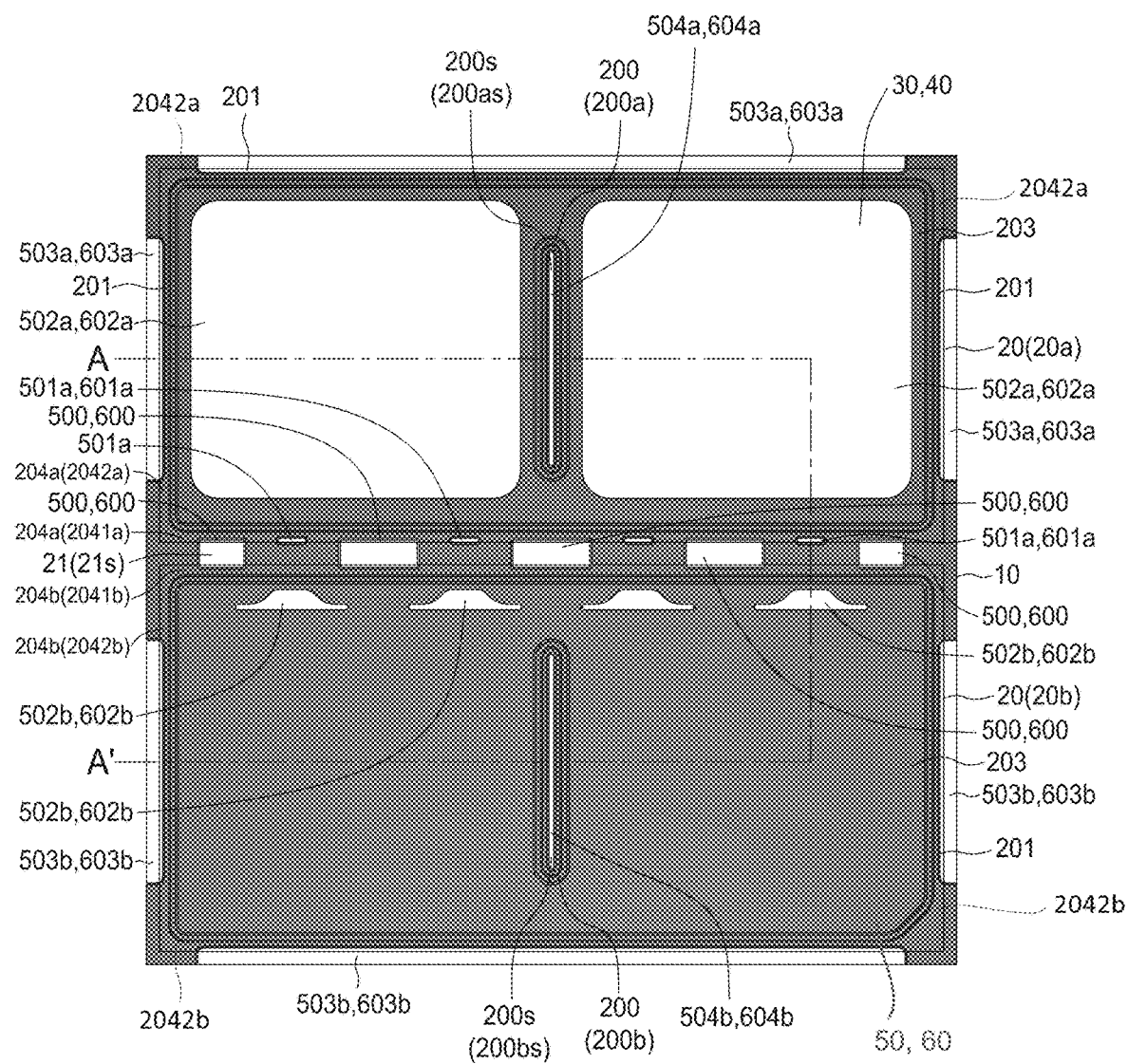
FIG. 5 illustrates a top view a first insulating layer and a second insulating layer in accordance with an embodiment of the present application.
Figure 6:
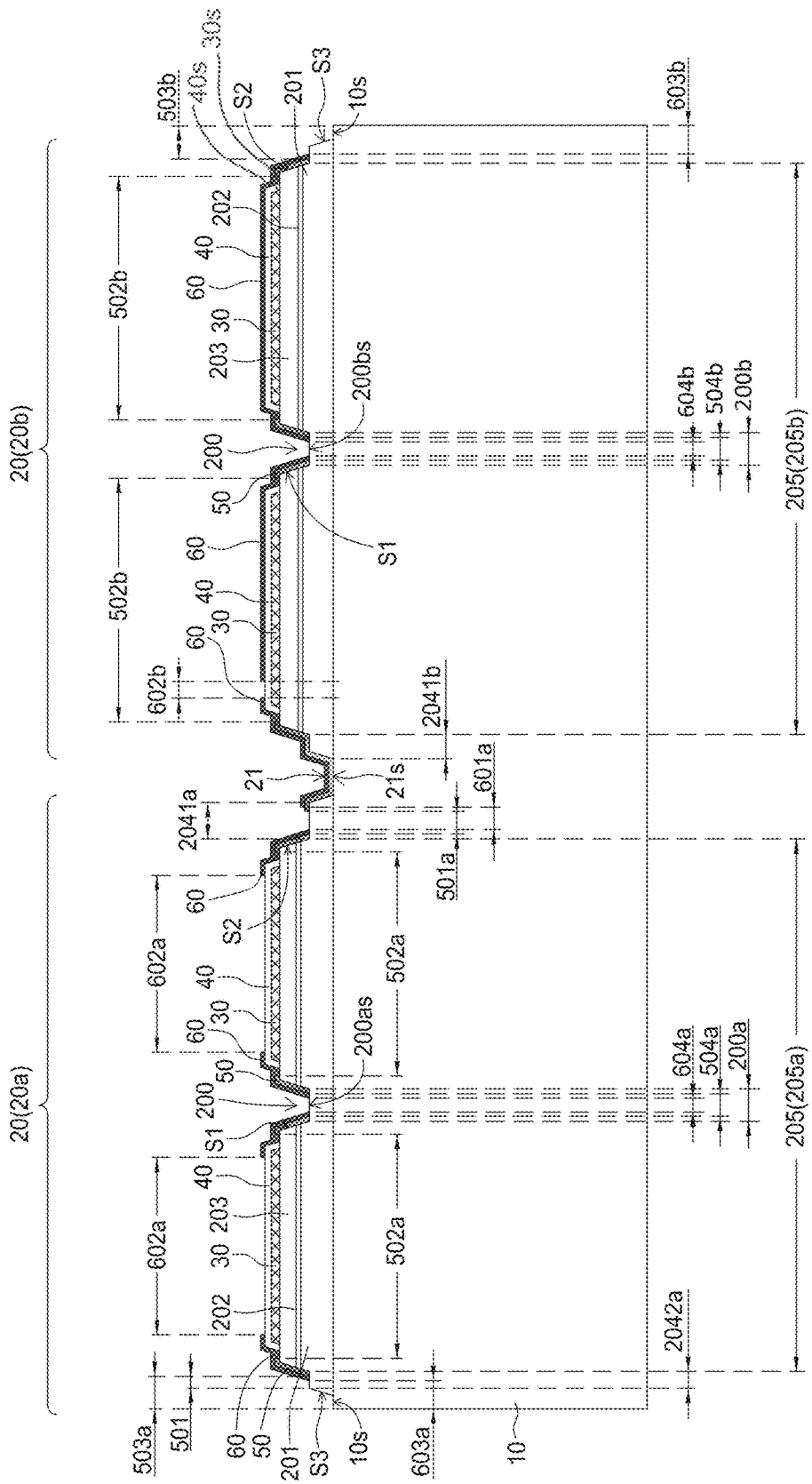
FIG. 6 illustrates a cross-sectional view taken along line A-A' of FIG. 5.

FIG. 3 illustrates a top view showing a contact electrode and a reflective layer formed on the semiconductor stack in accordance with an embodiment of the present application. FIG. 4 illustrates a cross-sectional view taken along line A-A' of FIG. 3. FIG. 5 illustrates a top view of a first insulating layer, a contact electrode, a reflective layer and a second insulating layer in accordance with an embodiment of the present application. FIG. 6 illustrates a cross-sectional view taken along line A-A' of FIG. 5.

As shown in FIG. 5, a first insulating layer 50 is formed on the substrate 10 and each of the light-emitting units 20. One or a plurality of openings 500 of the first insulating layer 50 are formed on the first light-emitting unit 20a, the second light-emitting unit 20b, and the trench 21 by selective etching to expose the substrate 10, the first semiconductor layer 201 of the first light-emitting unit 20a and the first semiconductor layer 201 of the second light-emitting unit 20b. In an embodiment, the one or the plurality of openings 500 of the first insulating layer 50 formed on the trench 21 exposes the first semiconductor layer 201 of the first inner recess 2041a and the first semiconductor layer 201 of the second inner recess 2041b.

As shown in FIG. 5 and FIG. 6, one or a plurality of first openings 501a of the first insulating layer 50 is formed on the first inner recess 2041a of the first light-emitting unit 20a adjacent to a side of the trench 21 to expose the first semiconductor layer 201 of the first light-emitting unit 20a.

As shown in FIG. 5, one or a plurality of second openings 502a and 502b of the first insulating layer 50 are respectively formed on the second semiconductor layer 203 of the first light-emitting unit 20a and the second semiconductor layer 203 of the second light-emitting unit 20b to expose the second semiconductor layer 203, the contact electrode 30, and/or the reflective layer 40.

As shown in FIG. 5, one or a plurality of third openings 503a of the first insulating layer 50 are formed on the plurality of first outer recesses 2042a of the first light-emitting unit 20a to expose the first semiconductor layer 201 of the first light-emitting unit 20a. Another one or an another plurality of third openings 503b of the first insulating layer 50 are formed on the plurality of second outer recesses 2042b of the second light-emitting unit 20b to expose the first semiconductor layer 201 of the second light-emitting unit 20b.

As shown in FIG. 5, the fourth openings 504a, 504b of the first insulating layer 50 are respectively formed on the first via 200a of the first light-emitting unit 20a and the second via 200b of the second light-emitting unit 20b to expose the first semiconductor layer 201. The remaining area shown in FIG. 5 is covered by the first insulating layer 50.

In an embodiment, the first insulating layer 50 comprises an insulating material having light transparency. For example, the material of the first insulating layer 50 comprises $SiO_x$.

In an embodiment, the first insulating layer 50 comprises two or more materials of different refractive indices alternately stacked to form a Distributed Bragg Reflector (DBR). In an embodiment, the first insulating layer 50 is laminated with sub-layers of $SiO_2/TiO_2$ or $SiO_2/Nb_2O_5$ to selectively reflect light of a specific wavelength, thereby increasing the light extraction efficiency of the light-emitting device. When the peak emission wavelength of the light-emitting device 1 is λ, the optical thickness of the first insulating layer 50 can an integral multiple of λ/4. The peak emission wavelength refers to the wavelength having a strongest intensity in the emission spectrum of the light-emitting device 1. The thickness of the first insulating layer 50 may have a deviation of ±30% on the basis of an integral multiple of the optical thickness 24.

In an embodiment of the present application, the first insulating layer 50 comprises a non-conductive material comprising organic material, inorganic material or dielectric material. The organic material comprises Su8, benzocyclobutene (BCB), perfluorocyclobutane (PFCB), epoxy resin, acrylic resin, cyclic olefin polymers (COC), polymethylmethacrylate (PMMA), polyethylene terephthalate (PET), polycarbonate (PC), polyetherimide, or fluorocarbon polymer. The inorganic material comprises silicone or glass. The dielectric material comprises aluminum oxide ($Al_2O_3$), silicon nitride ($SiN_x$), silicon oxide ($SiO_x$), titanium oxide ($TiO_x$), or magnesium fluoride ($MgF_x$).

In an embodiment of the present application, the first insulating layer 50 comprises a thickness between 1000 angstrom (Å) and 20,000 angstrom (Å).

In an embodiment of the present application, the material of the first insulating layer 50 comprises $SiO_2$, $TiO_2$, or $SiN_x$. If the thickness of the first insulating layer 50 is less than 1000 angstrom (Å), the thinner thickness may make the insulating property of the first insulating layer 50 weak. Specifically, the first insulating layer 50 is formed on the etched first inclined surface S1 and the etched second inclined surface S2. The first insulating layer 50 conformally formed on the inclined surface comprises an inclined slope. If the first insulating layer 50 comprises a thickness less than 1000 angstrom (Å), it may cause cracking of the film.

In an embodiment of the present application, the material of the first insulating layer 50 comprises $SiO_2$, $TiO_2$ or $SiN_x$. If the thickness of the first insulating layer 50 is thicker than 20000 angstrom (Å), it is getting difficult to perform selective etching on the first insulating layer 50. However, the above embodiments do not exclude other materials having a good covering extensibility or a high etch selectivity to avoid the problem caused by the thin thickness or the thick thickness of the first insulating layer 50.

The first insulating layer 50 comprises a side surface which is an inclined surface having an angle with respect to a horizontally extending surface of the inner surface 200as or the outer surface 204as of the first semiconductor layer 201 exposed through selective etching. The inclined surface comprises the angle between 10 and 70 degrees with respect to the horizontally extending surface of the inner surface 200as or the outer surface 204as of the first semiconductor layer 201 exposed through selective etching.

If the angle of the side surface of the first insulating layer 50 is less than 10 degrees, the thickness of the first insulating layer 50 is substantially reduced. Therefore, it may be difficult to ensure the insulation properties.

If the angle of the side surface of the first insulating layer 50 is greater than 70 degrees, the insulating layer and the metal layer subsequently formed may not be completely covered, thereby causing the film cracking.

As shown in FIG. 4 and FIG. 6, a contact electrode 30 is formed on the second semiconductor layer 203 of each of the light-emitting units 20. Specifically, the contact electrode 30 is formed in one or the plurality of second openings 502a and 502b of the first insulating layer 50. In other words, the contact electrode 30 is exposed by one or the plurality of second openings 502a and 502b of the first insulating layer 50 of the light-emitting units 20. The contact electrode 30 comprises a transparent electrode. The material of the transparent electrode comprises a light-transmitting conductive oxide or a light-transmitting metal. The light-transmitting conductive oxide comprises indium tin oxide (ITO), zinc oxide (ZnO), zinc indium tin oxide (ZITO), zinc indium oxide (ZIO), zinc tin oxide (ZTO), gallium indium tin oxide (GITO), gallium indium oxide (GIO) or gallium zinc oxide (GZO). The light-transmitting conductive oxide comprises various dopants such as aluminum doped zinc oxide (AZO) or fluorine doped tin oxide (FTO). The light-transmitting metal comprises nickel (Ni) or gold (Au).

The thickness of the contact electrode 30 is not limited, but may have a thickness between 0.1 nm and 100 nm. In an embodiment, the material of the contact electrode 30 comprises a light-transmitting conductive oxide. If the thickness of the contact electrode 30 is less than 0.1 nm, the thickness of the contact electrode 30 is too thin to ohmic contact with the second semiconductor layer 203. If the thickness of the contact electrode 30 is larger than 100 nm, the contact electrode 30 having the thick thickness may partially absorb the light emitted from the active layer 202, and the luminance of the light-emitting device 1 is reduced. Since the contact electrode 30 has a thickness in the range described above, the current can be uniformly spread in the horizontal direction to improve the electrical performance of the light-emitting device 1. However, the above embodiments do not exclude other materials being capable of lateral current spreading.

The contact electrode 30 is formed on substantially the entire surface of the second semiconductor layer 203 of each of the light-emitting units 20, and forms a low-resistance contact with the second semiconductor layer 203 of each of the light-emitting units 20, such as an ohmic contact. The electrical current uniformly spread through the second semiconductor layer 203 by the contact electrode 30. In an embodiment, in a cross-sectional view of the light-emitting device 1, the contact electrode 30 comprises an outermost side 30s which is separated from the second inclined surface S2 of the light-emitting unit 20 by a horizontal distance less than 20 μm, preferably less than 10 μm, and more preferably less than 5 μm.

A reflective layer 40 is formed on the contact electrode 30 of each of the light-emitting units 20. The material of the reflective layer 40 comprises a metal such as aluminum (Al), silver (Ag), rhodium (Rh), platinum (Pt) or an alloy of the above materials. The reflective layer 40 reflects light and the reflected light emits outward in a direction toward the substrate 10, wherein the light is formed in the active layer 202 of each of the light-emitting units 20.

In another embodiment, the step of forming the contact electrode 30 may be omitted. A reflective layer 40 is formed in one or the plurality of second openings 502a and 502b of the first insulating layer 50 of the light-emitting units 20, and the reflective layer 40 forms an ohmic contact with the second semiconductor layer 203.

In an embodiment, in a cross-sectional view of the light-emitting device, as shown in FIG. 4 and FIG. 6, the reflective layer 40 comprises an outermost side 40s that is separated from the second inclined surface S2 of the light-emitting unit 20 by a horizontal distance less than 20 μm, preferably less than 10 μm, more preferably less than 5 μm.

In an embodiment, the reflective layer 40 can be a structure comprising one or more layers, such as a Distributed Bragg reflector.

In one embodiment, a surface of the reflective layer 40 is an inclined surface with respect to the upper surface of the second semiconductor layer 203, and the inclined surface comprises an angle between 10 and 60 degrees with respect to the surface of the second semiconductor layer 203. The material of the reflective layer 40 can be silver (Ag). If the angle of the reflective layer 40 is less than 10 degrees, a gentle slope can lower the reflection efficiency of the light. In addition, an angle less than 10 degrees is also difficult to achieve a uniform thickness. If the angle of the reflective layer 40 is greater than 60 degrees, it may cause cracking of the film subsequently formed. However, the above embodiments do not exclude other materials having high reflectance.

The adjustment of the angle of the reflective layer 40 can be achieved by changing the configuration of the substrate and the deposition direction of the metal atoms in the thermal deposition process. For example, the position of the substrate is adjusted such that the surface of the substrate is an inclined surface with respect to the deposition direction in the evaporation or sputtering.

In an embodiment, a barrier layer (not shown) is formed on the reflective layer 40 of each of the light-emitting units 20 to cover the upper surface and the side surface of the reflective layer 40 to avoid surface oxidation of the reflective layer 40 which deteriorated the reflectivity of the reflective layer 40. The material of the barrier layer comprises a metal material such as titanium (Ti), tungsten (W), aluminum (Al), indium (In), tin (Sn), nickel (Ni), chromium (Cr), platinum (Pt) or an alloy of the above materials. The barrier layer comprises one or more layers, such as titanium (Ti)/aluminum (Al), and/or nickel titanium alloy (NiTi)/titanium tungsten alloy (TiW). In an embodiment of the present application, the barrier layer comprises a laminated structure comprising titanium (Ti)/aluminum (Al) and a laminated structure comprises nickel titanium alloy (NiTi)/titanium tungsten alloy (TiW), wherein laminated structure comprising titanium (Ti)/aluminum (Al) is formed on one side away from the reflective layer 40, and the laminated structure comprises nickel titanium alloy (NiTi)/titanium tungsten alloy (TiW) is adjacent to one side adjacent to the reflective layer 40. In an embodiment of the invention, the material of the reflective layer 40 and the barrier layer preferably comprises a metal material other than gold (Au) or copper (Cu).

The laminated structure of the barrier layer comprises nickel titanium alloy (NiTi)/titanium tungsten alloy (TiW)/platinum (Pt)/titanium (Ti)/aluminum (Al)/titanium (Ti)/aluminum (Al)/Chromium (Cr)/platinum (Pt), the barrier layer comprises an angle between 10 and 60 degrees with respect to the upper surface of the second semiconductor layer 203. In an embodiment, if the angle of the barrier layer is less than 10 degrees, the gentle slope cannot completely cover the reflective layer 40 and is also difficult to achieve a uniform thickness. If the angle of the barrier layer is greater than 60 degrees, it may cause cracking of the film subsequently formed.

In an embodiment, the thickness of the reflective layer 40 or the barrier layer is preferably between 100 nm and 1 μm. If the thickness of the reflective layer 40 or the barrier layer is less than 100 nm, the light emitted from the active layer 203 cannot be effectively reflected. If the thickness of the reflective layer 40 or the barrier layer is larger than 1 μm, the manufacturing loss is caused by excessive production time.

In order to cover the upper surface and the side surface of the reflective layer 40, the barrier layer comprises a bottom surface contacting the second semiconductor layer 203 and/or the contact electrode 30.

As shown in FIG. 5, a second insulating layer 60 is formed on the substrate 10 and each of the light-emitting units 20. One or a plurality of openings 600 of the second insulating layer 60 is formed on the first light-emitting unit 20a, the second light-emitting unit 20b and the trench 21 by selectively etching to expose the substrate 10, the first semiconductor layer 201 of the first light-emitting unit 20a and the first semiconductor layer 201 of the second light-emitting unit 20b. In an embodiment, the one or the plurality of openings 600 of the second insulating layer 60 formed adjacent to the trench 21 exposes the first semiconductor layer 201 of the first recess 2041a and the first semiconductor layer 201 of the second recess 2041b.

As shown in FIG. 5 and FIG. 6, one or the plurality of first openings 601a of the second insulating layer 60 is formed on the first recess 2041a of the first light-emitting unit 20a adjacent to the trench 21 to expose the first semiconductor layer 201.

As shown in FIG. 5, one or a plurality of second openings 602a and 602b of the second insulating layer 60 are respectively formed on the second semiconductor layer 203 of the first light-emitting unit 20a and the second semiconductor layer 203 of the second light-emitting unit 20b to expose the second semiconductor layer 203, the contact electrode 30 and/or the reflective layer 40.

As shown in FIG. 5, in the top view of the light-emitting device 1, the positions of the plurality of first openings 601a of the second insulating layer 60 and the plurality of second openings 602b of the second insulating layer 60 are aligned with each other.

As shown in FIG. 5, one or a plurality of third openings 603a of the second insulating layer 60 are respectively formed on the plurality of first outer recesses 2042a of the first light-emitting unit 20a to expose the first semiconductor layer 201 of the first light-emitting unit 20a. Another one or an another plurality of third openings 603b of the second insulating layer 60 are formed on the plurality of second outer recesses 2042b of the second light-emitting unit 20b to expose the first semiconductor layer 201 of the second light-emitting unit 20b.

As shown in FIG. 5, the fourth openings 604a and 604b of the second insulating layer 60 are respectively formed on the first via 200a of the first light-emitting unit 20a and the second via 200b of the second light-emitting unit 20b to expose the first semiconductor layer 201. The remaining area shown in FIG. 5 is shielded by the second insulating layer 60.

The number and/or the position of the first opening 601a of the second insulating layer 60 corresponds to that of the first opening 501a of the first insulating layer 50. The number and/or the position of the third openings 603a, 603b of the second insulating layer 60 respectively corresponds to that of the third openings 503a, 503b of the first insulating layer 50. The number and/or the position of the fourth openings 604a, 604b of the second insulating layer 60 respectively corresponds to that of the fourth openings 504a, 504b of the first insulating layer 50.

The positions of the second openings 602a, 602b of the second insulating layer 60 partially overlap with the positions of the second openings 502a, 502b of the first insulating layer 50. The opening number of the second openings 602a, 602b of the second insulating layer 60 is different from the opening number of the second openings 502a, 502b of the first insulating layer 50. In an embodiment, the plurality of second openings 602a, 602b of the second insulating layer 60 are respectively formed on the second openings 502a, 502b of the first insulating layer 50. The first opening 502a, 502b of the first insulating layer 50 has a size larger than that of any of the plurality of second openings 602a, 602b of the second insulating layer 60.

In an embodiment, the second insulating layer 60 comprises an insulating material having light transparency. For example, the second insulating layer 60 comprises $SiO_x$.

In an embodiment, the second insulating layer 60 comprises two or more materials having different refractive indices alternately stacked to form a Distributed Bragg Reflector (DBR). In an embodiment, the second insulating layer 60 is laminated with sub-layers of $SiO_2/TiO_2$ or $SiO_2/Nb_2O_5$ to selectively reflect light of a specific wavelength, thereby increasing the light extraction efficiency of the light-emitting device 1. When the peak emission wavelength of the light-emitting device 1 is λ, the optical thickness of the second insulating layer 60 can an integral multiple of λ/4. The peak emission wavelength refers to the wavelength having a strongest intensity in the emission spectrum of the light-emitting device 1. The thickness of the second insulating layer 60 may have a deviation of ±30% on the basis of an integral multiple of the optical thickness 24.

The second insulating layer 60 comprises a non-conductive material comprising organic material, inorganic material or dielectric material. The organic material comprises Su8, benzocyclobutene (BCB), perfluorocyclobutane (PFCB), epoxy resin, acrylic resin, cyclic olefin polymers (COC), polymethylmethacrylate (PMMA), polyethylene terephthalate (PET), polycarbonate (PC), polyetherimide, or fluorocarbon polymer. The inorganic material comprises silicone or glass. The dielectric material comprises aluminum oxide ($Al_2O_3$), silicon nitride ($SiN_x$), silicon oxide ($SiO_x$), titanium oxide ($TiO_x$), or magnesium fluoride ($MgF_x$).

In an embodiment of the present application, the second insulating layer 60 comprises a thickness between 1000 angstrom (Å) and 20,000 angstrom (Å).

In an embodiment of the present application, the material of the second insulating layer 60 comprises $SiO_2$, $TiO_2$ or $SiN_x$. If the thickness of the second insulating layer 60 is less than 1000 angstrom (Å), the thinner thickness may make the insulating property of the second insulating layer 60 weak. Specifically, the second insulating layer 60 is formed on the etched first inclined surface S1 and the etched second inclined surface S2. The second insulating layer 60 conformally formed on the inclined surface comprises an inclined slope. If the second insulating layer 60 comprises a thickness less than 1000 Å, it may cause cracking of the film.

In an embodiment of the present application, the material of the second insulating layer 60 comprises $SiO_2$, $TiO_2$ or $SiN_x$. If the thickness of the second insulating layer 60 is thicker than 20000 angstrom (Å), it is getting difficult to perform selective etching on the second insulating layer 60. However, the above embodiments do not exclude other materials having a good covering extensibility or a high etch selectivity to avoid the problem caused by the thin thickness or the thick thickness of the second insulating layer 60.

The second insulating layer 60 comprises a surface which is an inclined surface with respect to a horizontally extending surface of the inner surface 200as or the outer surface 204as of the first semiconductor layer 201 exposed through selective etching. The inclined surface comprises an angle ranged between 10 degrees and 70 degrees with respect to a horizontally extending surface of the inner surface 200as or the outer surface 204as of the first semiconductor layer 201 exposed through selective etching.

If the angle of the surface of the first insulating layer 50 is less than 10 degrees, the thickness of the second insulating layer 60 can be substantially reduced. Therefore, it may be difficult to ensure the insulation properties.

If the angle of the surface of the second insulating layer 60 is greater than 70 degrees, the insulating layer and the metal layer subsequently formed may not completely cover the second insulating layer 60, thereby causing the film cracking thereof.

Figure 7:
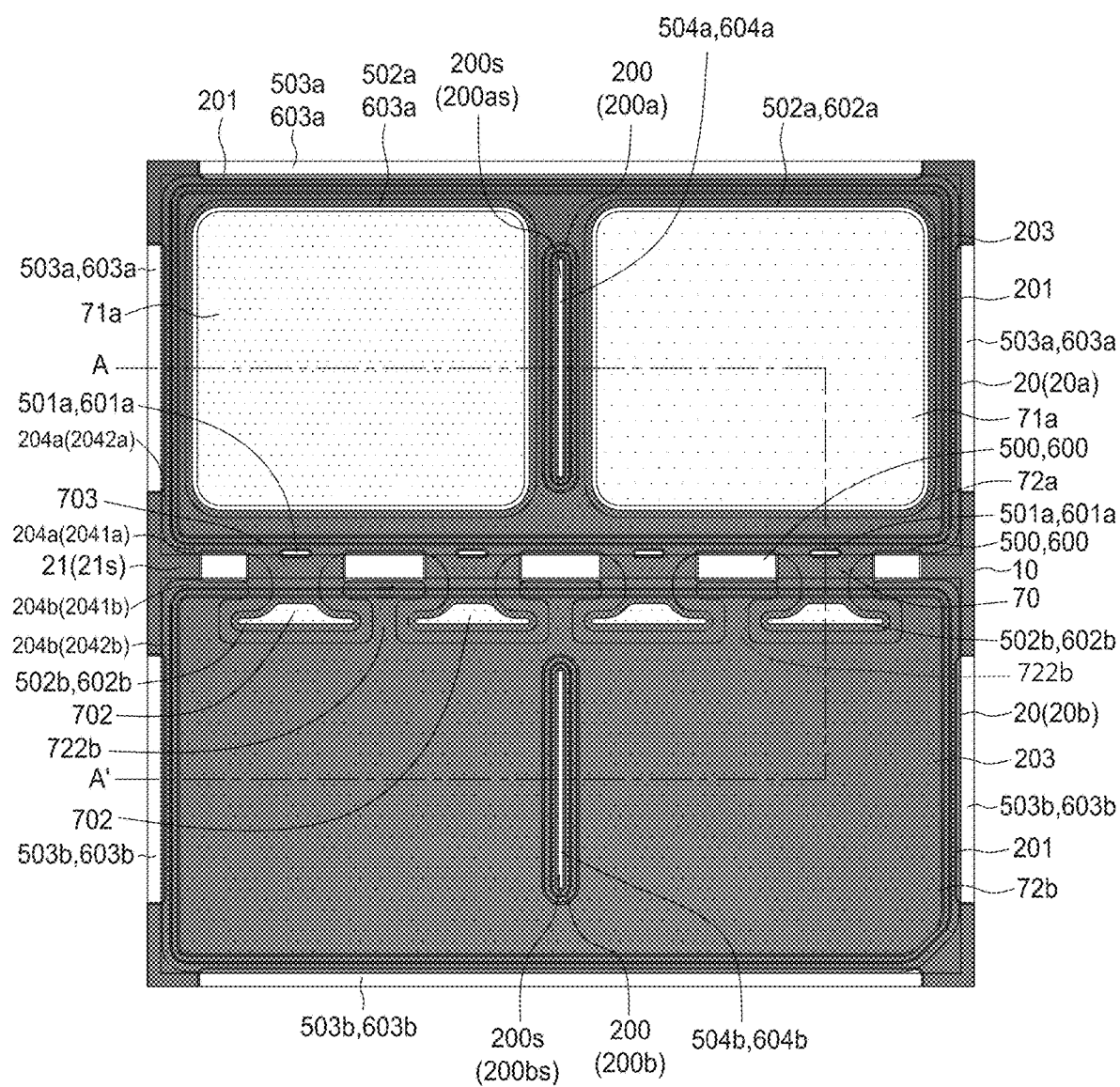
FIG. 7 illustrates a top view showing a top electrode, a bottom electrode and a connecting electrode formed on the semiconductor stack in accordance with an embodiment of the present application.

FIG. 7 illustrates a top view showing a top electrode, a bottom electrode and a connecting electrode formed on the semiconductor stack in accordance with an embodiment of the present application. FIG. 7A and FIG. 7B illustrate partial enlarged views of FIG. 7. FIG. 8 illustrates a cross-sectional view taken along line A-A' of FIG. 7. One or a plurality of connecting electrodes 70 is formed between the first light-emitting unit 20a and the second light-emitting unit 20b. One or the plurality of connecting electrodes 70 comprises a first connecting part 701 on the first inner recess 2041a of the first light-emitting unit 20a, which covers the first opening 601a of the second insulating layer 60 and electrically connected to the first semiconductor layer 201 of the first light-emitting unit 20a through the first opening 601a of the second insulating layer 60 and the first opening 501a of the first insulating layer 50; a second connecting part 702 formed on the second semiconductor layer 203 of the second light-emitting unit 20b and electrically connected to the second semiconductor layer 203 of the second light-emitting unit 20b through the second opening 602b of the second insulating layer 60 and the second opening 502b of the first insulating layer 50, and a third connecting part 703 formed in the trench 21 and between the first connecting part 701 and the second connecting part 702.

In an embodiment of the present application, as shown in FIG. 7A, the first connecting part 701 of the connecting electrodes 70 comprises a first connecting segment 7011 formed in the first opening 601a of the second insulating layer 60 of the first light-emitting unit 20a. The second connecting part 702 of the connecting electrodes 70 comprises a second connecting segment 7022 formed in the second opening 602b of the second insulating layer 60 of the second light-emitting unit 20b.

In an embodiment, as shown in FIG. 7A, the first connecting segment 7011 of the first connecting part 701 formed in the first opening 601a of the second insulating layer 60 directly contacts the first semiconductor layer 201 of the first light-emitting unit 20a. The second connecting segment 7022 of the second connecting part 702 formed in the second insulating layer second opening 602b contacts the barrier layer, the reflective layer 40 or the contact electrode 30.

In an embodiment of the present application, as shown in FIG. 7A, in the top view of the light-emitting device 1, the third connecting part 703 comprises a first segment 7031 formed on the third surface S3 of the first light-emitting unit 20a, and a second segment 7032 formed on the third surface S3 of the second light-emitting unit 20b. The first connecting segment 7031 and/or the second segment 7032 comprises a width larger than 15 µm, preferably larger than 30 µm, more preferably larger than 50 µm.

In an embodiment, in order to uniformly inject the electrical current from the first light-emitting unit 20a into the second light-emitting unit 20b, a total area of the second light-emitting unit 20b provided for the injected current is increased, and the electrical current density in the cross-sectional area of the second connecting part 702 is reduced. As shown in FIG. 7 and FIG. 7A, in the top view of the light-emitting device 1, the second opening 602b of the second insulating layer 60 of the second light-emitting unit 20b comprises a first opening area larger than a second opening area of the first opening 601a of the second insulating layer 60 of the first light-emitting unit 20a. The first connecting segment 7011 of the first connecting part 701 comprises a first width W1 smaller than a second width W2 of the second connecting segment 7022 of the second connecting part 702. The second segment 7032 of the third connection part 703 comprises a third width W3 smaller than a width of the first segment 7031 of the third connection part 703, and a width between the first segment 7031 of the third connection part 703 and the second segment 7032 of the third connection part 703 is gradually changed.

In another embodiment (not shown), in order to uniformly inject the electrical current from the first light-emitting unit 20a into the second light-emitting unit 20b, a total area of the second light-emitting unit 20b provided for the injected current is increased, and the electrical current density in the cross-sectional area of the second connecting part 702 is reduced. The first connecting segment 7011 of the first connecting part 701 comprises a first width W1 smaller than a second width W2 of the second connecting segment 7022 of the second connecting part 702. The second segment 7032 of the third connection part 703 comprises a third width W3 same as a width of the first segment 7031 of the third connection part 703.

In another embodiment (not shown), in order to uniformly spread the electrical current on the first connecting part 701 and the first surrounding part 204a, the first width W1 of the first connecting segment 7011 of the first connecting part 701 is larger than the second width W2 of the second connecting segment 7022 of the second connecting part 702, and the third width W3 of the third connection part 703 is larger than the second width W2 of the second connecting segment 7022 of the second connecting part 702.

In another embodiment (not shown), in order to avoid uneven current density flowing through the connection electrode 70, the first width W1 of the first connecting segment 7011 of the first connecting part 701 is same as the second width W2 of the second connecting segment 7022 of the second connecting part 702. The third width W3 of the third connection part 703 is larger than the first width W1 of the first connecting segment 7011 and/or the second width W2 of the second connecting segment 7022.

In an embodiment, one or a plurality of first top electrodes 71a is respectively formed in the one or the plurality of second openings 602a of the second insulating layer 60 of the first light-emitting unit 20a, and electrically connected to the second semiconductor layer 203 of the first light-emitting unit 20a.

A first bottom electrode 72a covers the first inner recess 2041a and the plurality of first outer recesses 2042a of the first light-emitting unit 20a. The first bottom electrode 72a directly contacts the first semiconductor layer 201 of the first inner recess 2041a of the first light-emitting unit 20a through the one or the plurality of openings 600 of the second insulating layer 60 and the one or the plurality of first openings 601a of the second insulating layer 60. The first bottom electrode 72a directly contacts the first semiconductor layer 201 on the plurality of first outer recesses 2042a through the one or the plurality of third openings 603a of the second insulating layer 60, and electrically connected to the first semiconductor layer 201 of the first light-emitting unit 20a. The first bottom electrode 72a directly contacts the first semiconductor layer 201 on the first via 200a through the fourth opening 604a of the second insulating layer 60, and electrically connected to the first semiconductor layer 201 of the first light-emitting unit 20a. In the top view of the light-emitting device 1, the plurality of openings 600 of the second insulating layer 60 and the plurality of connecting electrodes 70 are alternately arranged. The first bottom electrode 72a extends along the second inclined surface S2 of the first light-emitting unit 20a to cover the first semiconductor mesa 205a to reflect the light emitted from the active layer 202 of the first light-emitting unit 20a.

The second insulating layer openings 600, the first openings 601a of the second insulating layer 60 and the third openings 603a of the second insulating layer 60 expose the first semiconductor layer 201 of the first surrounding part 204a of the first light-emitting unit 20a. In the top view of the light-emitting device 1, the opening 600 of the second insulating layer 60, the first opening 601a of the second insulating layer 60 and the third opening 603a of the second insulating layer 60 comprise different sizes. The size comprises an area, a width, or a depth.

The second insulating layer 60 is formed between the first top electrodes 71a and the first bottom electrode 72a to avoid a short circuit caused by the contacting of the first top electrodes 71a and the first bottom electrode 72a. A portion of the second insulating layer 60 is located below the first bottom electrode 72a which extends over the first semiconductor mesa 205a to prevent the first bottom electrode 72a from contacting the barrier layer, the reflective layer 40, and/or the contact electrode 30.

The first surrounding part 204a of the first light-emitting unit 20a comprises the first inner recess 2041a and the plurality of first outer recesses 2042a to form a rectangle shape, and is located around the first light-emitting unit 20a, wherein the first inner recess 2041a is adjacent to one side of the trench 21 with respect to the plurality of first outer recesses 2042a. In the top view of the light-emitting device 1, as shown in FIG. 7, the plurality of openings 600 of the second insulating layer 60 and the plurality of first openings 601a of the second insulating layer 60 are alternately arranged to expose the first semiconductor layer 201 of the first light-emitting unit 20a. In a direction parallel to a side of the first inner recess 2041a, the opening 600 of the second insulating layer 60 comprises a width larger than or less than a width of the first opening 601a of the second insulating layer 60 to uniformly spread electrical current adjacent to the connecting electrode 70.

As shown in FIG. 7, the first bottom electrode 72a is formed in the openings 600 of the second insulating layer 60, extends over the second insulating layer 60, and connects to the first connecting segment 7011 of the first connecting part 701 formed in the first opening 601a of the second insulating layer 60.

In the top view of the light-emitting device 1, as shown in FIG. 7, the one or the plurality of first top electrodes 71a formed on the first light-emitting unit 20a is respectively surrounded by the first bottom electrode 72a.

In an embodiment, in the top view of the light-emitting device 1, as shown in FIG. 7, the one or the plurality of first top electrodes 71a formed on the first light-emitting unit 20a comprises a first top surface area larger than a first bottom surface area of the first bottom electrode 72a.

In another embodiment (not shown), in the top view of the light-emitting device 1, the one or the plurality of first top electrodes 71a formed on the first light-emitting unit 20a comprises a first top surface area smaller than a first bottom surface area of the first bottom electrode 72a.

In another embodiment (not shown), the one or the plurality of first top electrodes 71a formed on the first light-emitting unit 20a comprises a first top surface area same as a first bottom surface area of the first bottom electrode 72a.

A second bottom electrode 72b covers the second inner recess 2041b of the second light-emitting unit 20b and the plurality of second outer recesses 2042b. The second bottom electrode 72b directly contacts with the first semiconductor layer 201 on the second inner recess 2041b through the one or the plurality of openings 600 of the second insulating layer 60. The second bottom electrode 72b directly contacts the first semiconductor layer 201 of the plurality of second outer recesses 2042b through the one or the plurality of third openings 603b of the second insulating layer, and is electrically connected to the first semiconductor layer 201 of the second light-emitting unit 20b. The second bottom electrode 72b directly contacts the first semiconductor layer 201 located in the second via 200b through the fourth opening 604b of the second insulating layer 60, and is electrically connected to the first semiconductor layer 201 of the second light-emitting unit 20b. In the top view of the light-emitting device 1, the plurality of openings 600 of the second insulating layer 60 and the plurality of connecting electrodes 70 are alternately arranged. The second bottom electrode 72b extends along the second inclined surface S2 of the second light-emitting unit 20b to cover the second semiconductor mesa 205b to reflect the light emitted from the active layer 202.

As shown in FIG. 8, the second insulating layer 60 is located under the second bottom electrode 72b to prevent the second bottom electrode 72b from contacting the barrier layer, the reflective layer 40, and/or the contact electrode 30.

In an embodiment, as shown in FIG. 7, in the top view of the light-emitting device 1, the second bottom electrode 72b located on the second light-emitting unit 20b comprises a second bottom surface area larger than a first bottom surface area of the first bottom electrode 72a on the first light-emitting unit 20a.

In another embodiment, as shown in FIG. 7, in the top view of the light-emitting device 1, the second bottom electrode 72b located on the second light-emitting unit 20b comprises a second bottom surface area larger than a first top surface area each of the first top electrodes 71a on the first light-emitting unit 20a.

In another embodiment, as shown in FIG. 7, in the top view of the light-emitting device 1, the second bottom electrode 72b located on the second light-emitting unit 20b comprises a second bottom surface area larger than a sum of the first top surface areas of the plurality of first top electrode 71a on the first light-emitting unit 20a.

As shown in FIG. 7, the trench 21 is located between the first inner recess 2041a of the first light-emitting unit 20a and the second inner recess 2041b of the second light-emitting unit 20b. The opening 500 of the first insulating layer 50 and the opening 600 of the second insulating layer 60 expose the surface 21s of the substrate 10, the first semiconductor layer 201 on the first inner recess 2041a, and the first semiconductor layer 201 on the second inner recess 2041b. In other words, the opening 500 of the first insulating layer 50 and the opening 600 of the second insulating layer 60 formed adjacent to the trench 21 expose the first semiconductor layer 201 of the first inner recess 2041a and the second inner recess 2041b at same positions. The first bottom electrode 72a comprises a portion formed in the opening 500 of the first insulating layer 50 and the opening 600 of the second insulating layer 60 and directly contacting the first semiconductor layer 201 on the first inner recess 2041a. The second bottom electrode 72b comprises a portion formed in the opening 500 of the first insulating layer 50 and the opening 600 of the second insulating layer 60 and directly contacting the first semiconductor layer 201 on the second inner recess 2041b. The first bottom electrode 72a and the second bottom electrode 72b are separated from each other by the trench 21.

As shown in FIG. 7B, the second bottom electrode 72b comprises one or a plurality of second bottom electrode recesses 721b accommodating one or a plurality of second connection parts 702; and one or a plurality of second bottom electrode protrusions 722b formed between two adjacent of the second connecting parts 702. The second bottom electrode protrusion 722b comprises a width W4 larger or smaller than the width of the second connection part 702. In order to uniformly inject the electrical current from the second bottom electrode 72b into the first semiconductor layer 201 of the second light-emitting unit 20b, the second bottom electrode protrusions 722b further comprises one or a plurality of second bottom electrode extending portions 724b in the second inner recess 2041b. The second bottom electrode extending portion 724b extends into the opening 600 of the second insulating layer 60 to directly contact the first semiconductor layer 201 of the second inner recess 2041b. In order to increase the area for current injection, the second bottom electrode extending portion 724b comprises a width W5 larger than a width W4 of the second bottom electrode protrusion 722b.

In an embodiment, as shown in FIG. 7, in the top view of the light-emitting device 1, the second bottom electrode protrusion 722b comprises a width smaller than that of the second connection part 702.

In another embodiment (not shown), in the top view of the light-emitting device 1, the second bottom electrode protrusion 722b comprises a width larger than that of the second connection part 702.

As shown in FIG. 7, in the top view of the light-emitting device 1, the plurality of second bottom electrode protrusions 722b and the plurality of second connecting parts 702 are alternately arranged to uniformly inject the electrical current into the first semiconductor layer 201 and the second semiconductor layer 203 of the second light-emitting unit 20b. The plurality of second bottom electrode protrusions 722b comprises a number different from a number of the plurality of second connecting part 702. For example, the number of the second bottom electrode protrusions 722b is greater than or less than the number of the plurality of second connecting parts 702.

The first bottom electrode 72a located on the first light-emitting unit 20a directly contacts the outer surface 204as of the first semiconductor layer 201 of the first light-emitting unit 20a. The second bottom electrode 72b located on the second light-emitting unit 20b directly contacts the outer surface 204bs of the first semiconductor layer 201 of the second light-emitting unit 20b. As shown in FIG. 8, when the first bottom electrode 72a or the second bottom electrode 72b completely covers the outer surface 204as or the outer surface 204bs of the first semiconductor layer 201, the first bottom electrode 72a or the second bottom electrode 72b respectively comprises a first bottom electrode outer sidewall 72as and a second bottom electrode outer sidewall 72bs directly connecting the third surface S3 of the first semiconductor layer 201. In an embodiment, when the first bottom electrode 72a or the second bottom electrode 72b partially covers the outer surface 204as or the outer surface 204bs of the first semiconductor layer 201, the first bottom electrode outer sidewall 72as of the first bottom electrode 72a or the second bottom electrode outer side-wall 72bs of the second bottom electrode 72b is spaced apart from the third surface S3 of the first semiconductor layer 201 by a distance to partially expose the outer surface 204as or the outer surface 204bs of the first semiconductor layer 201 (not shown).

In an embodiment, the first top electrode 71a located at the first light-emitting unit 20a comprises an inclined side surface to reduce the risk of the films peeling off from the reflective layer 40 or the barrier layer, and to increase the coverage of the films subsequently formed. The first bottom electrode 72a located on the first light-emitting unit 20a and the second bottom electrode 72b located on the second light-emitting unit 20b respectively comprises an inclined side surface to reduce the risk of the films peeling from the first semiconductor layer 201 and increase the coverage of the films subsequently formed. The inclined side surface of the first top electrode 71a comprises an angle between 30 degrees and 75 degrees with respect to the surface of the reflective layer 40 or the barrier layer. The inclined side surface of the first bottom electrode 72a and/or the second bottom electrode 72b comprises an angle between 30 degrees and 75 degrees with respect to the surface of the first semiconductor layer 201.

The first top electrode 71a, the first bottom electrode 72a, and/or the second bottom electrode 72b comprises a metal material comprising chromium (Cr), titanium (Ti), tungsten (W), gold (Au), aluminum (Al), indium (In), tin (Sn), nickel (Ni), platinum (Pt) or an alloy of the above materials. The first top electrode 71a, the first bottom electrode 72a, and/or the second bottom electrode 72b comprises single layer or multilayers. For example, the first top electrode 71a, the first bottom electrode 72a, and/or the second bottom electrode 72b comprises Ti/Au stack, Ti/Pt/Au stack, Cr/Au stack, Cr/Pt/Au stack, Ni/Au stack, Ni/Pt/Au stack or Cr/Al/Cr/Ni/Au stack.

The first top electrode 71a, the first bottom electrode 72a, and/or the second bottom electrode 72b comprises a thickness preferably between 0.5 μm and 3.5 μm.

In an embodiment, the first top electrode 71a comprises a top surface lower than a top surface of the first bottom electrode 72a. In other words, a step height is formed between the top surface of the first top electrode 71a and the top surface of the first bottom electrode 72a, wherein the step height comprises a height between 2000 angstrom (Å) and 20,000 angstrom (Å).

In an embodiment, the step height is formed between the top surface of the first bottom electrode 72a and the top surface of the second bottom electrode 72b, wherein the step height comprises a height less than 2000 angstrom (Å), preferably less than 1000 angstrom (Å), more preferably less than 500 angstrom (Å).

In an embodiment, the top surface of the first bottom electrode 72a is substantially flush to the top surface of the second bottom electrode 72b.

Figure 9:
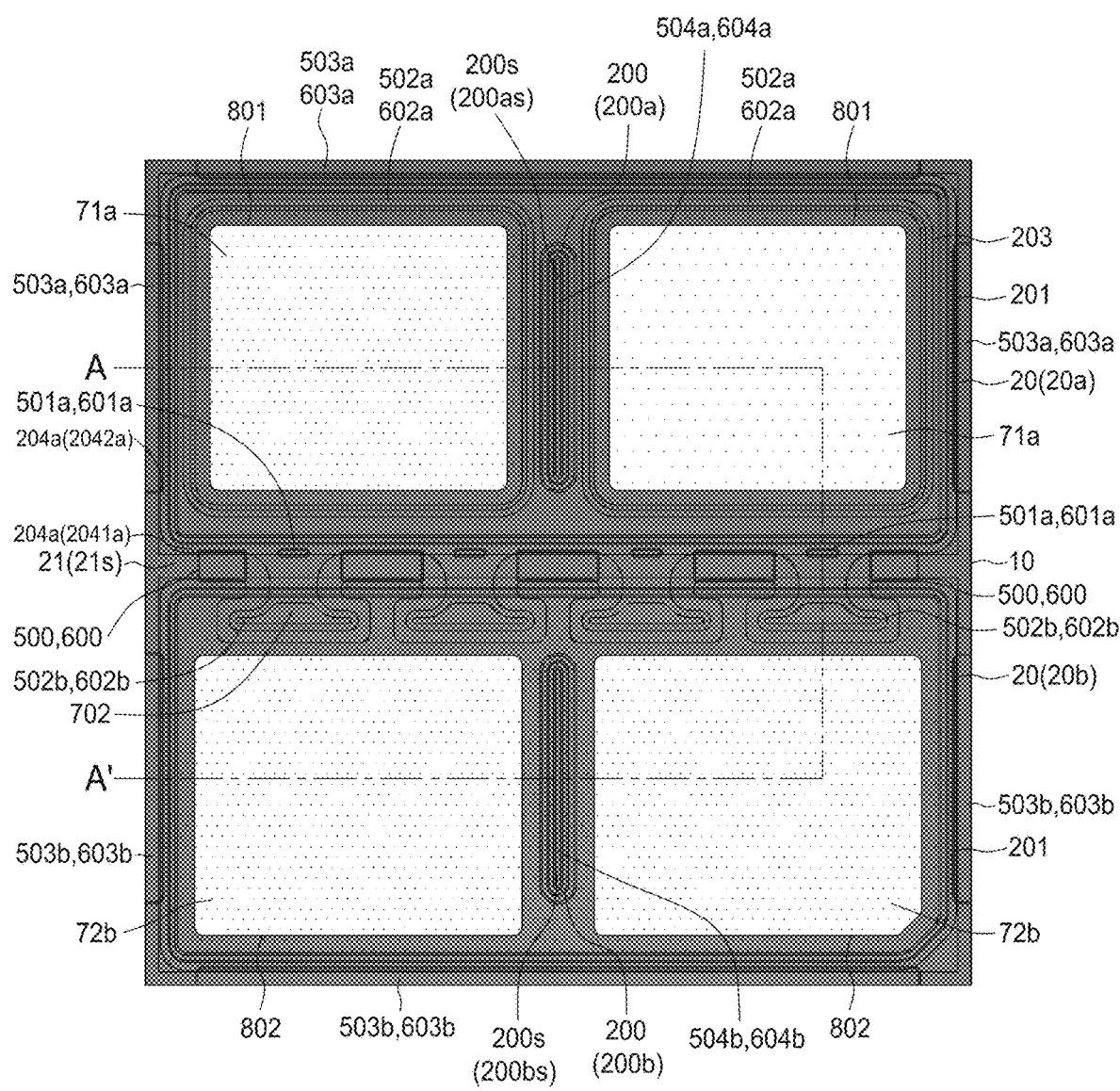
FIG. 9 illustrates a top view showing a third insulating layer formed on the semiconductor stack in accordance with an embodiment of the present application.
Figure 10:
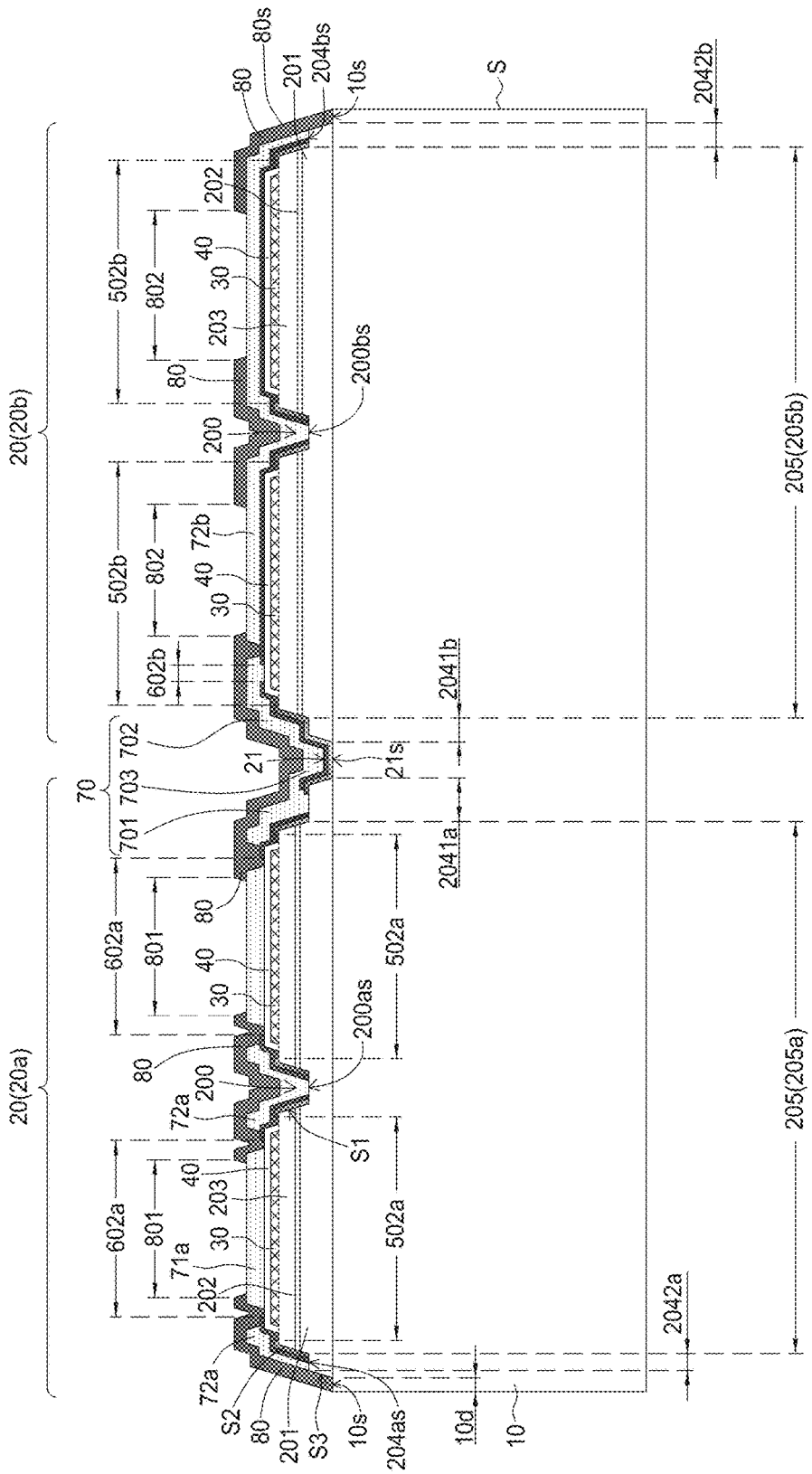
FIG. 10 illustrates a cross-sectional view taken along line A-A' of FIG. 9.

FIG. 9 illustrates a top view showing a formation of a third insulating layer in accordance with an embodiment of the present application. FIG. 10 illustrates a cross-sectional view taken along line A-A' of FIG. 9. A third insulating layer 80 is formed on the substrate 10 and each of the light-emitting units 20. One or a plurality of first openings 801 of the third insulating layer 80 and one or a plurality of second openings 802 of the third insulating layers 80 are formed on each of the light-emitting units 20 by selective etching. The one or the plurality of first openings 801 of the third insulating layer 80 exposes the one or the plurality of first top electrodes 71a on the first light-emitting units 20a. The one or the plurality of second openings 802 of the third insulating layer 80 exposes the second bottom electrodes 72b on the second light-emitting unit 20b. The remaining area is covered by the third insulating layer 80.

In an embodiment, as shown in FIG. 9, in the top view of the light-emitting device 1, the one or the plurality of first openings 801 of the third insulating layer 80 formed on the first light-emitting unit 20a comprises a width smaller than a width of the one or the plurality of second openings 802 of the third insulating layer 80 formed on the second light-emitting unit 20b, wherein the plurality of first openings 801 of the third insulating layer 80 comprises same width or different widths, and/or the plurality of second openings 802 of the third insulating layers 80 comprises same or different widths.

In another embodiment (not shown), the one or the plurality of first openings 801 of the third insulating layer 80 formed on the first light-emitting unit 20a comprises a width larger than a width of the one or the plurality of second openings 802 of the third insulating layer 80 formed on the second light-emitting unit 20b, wherein the plurality of first openings 801 of the third insulating layer 80 comprises same width or different widths, and/or the plurality of second openings 802 of the third insulating layers 80 comprises same or different widths.

In an embodiment, the light-emitting device 1 comprises the dicing street 10d located at the outermost side of the light-emitting device 1. The third insulating layer 80 covers the exposed upper surface 10s of the substrate 10. The third insulating layer 80 comprises a third insulating sidewall 80s that is directly connected to the outer sidewall S of the substrate 10 or separated from the outer sidewall S of the substrate 10 by a distance to expose the portion of the upper surface 10s of the substrate 10.

In another embodiment, the third surface S3 of the first semiconductor layer 201 is directly connected to the outer sidewall S of the substrate 10. The third insulating layer 80 covers the outer surface 204as or the outer surface 204bs of the first semiconductor layer 201, wherein the third insulating sidewall 80s of the third insulating layer 80 directly contacts the third surface S3 of the first semiconductor layer 201 or is separated from the third surface S3 of the first semiconductor layer 201 by a distance to partially expose the outer surface 204as or the outer surface 204bs of the first semiconductor layer 201.

In an embodiment, the third insulating layer 80 comprises an insulating material having light transparency. For example, the material of the third insulating layer 80 comprises $SiO_x$.

In an embodiment, the third insulating layer 80 may comprise two or more materials of different refractive indices alternately stacked to form a Distributed Bragg Reflector (DBR). In an embodiment, the third insulating layer 80 is laminated with sub-layers of $SiO_2/TiO_2$ or $SiO_2/Nb_2O_5$ to selectively reflect light of a specific wavelength, thereby increasing the light extraction efficiency of the light-emitting device. When the peak emission wavelength of the light-emitting device 1 is λ, the optical thickness of the third insulating layer 80 can an integral multiple of λ/4. The peak emission wavelength refers to the wavelength having a strongest intensity in the emission spectrum of the light-emitting device 1. The thickness of the third insulating layer 80 may have a deviation of ±30% on the basis of an integral multiple of the optical thickness λ/4.

In an embodiment of the present application, the third insulating layer 80 comprises a non-conductive material comprising organic material, inorganic material or dielectric material. The organic material comprises Su8, benzocyclobutene (BCB), perfluorocyclobutane (PFCB), epoxy resin, acrylic resin, cyclic olefin polymers (COC), polymethylmethacrylate (PMMA), polyethylene terephthalate (PET), polycarbonate (PC), polyetherimide, or fluorocarbon polymer. The inorganic material comprises silicone or glass. The dielectric material comprises aluminum oxide ($Al_2O_3$), silicon nitride ($SiN_x$), silicon oxide ($SiO_x$), titanium oxide ($TiO_x$), or magnesium fluoride ($MgF_x$).

In an embodiment of the present application, the third insulating layer 80 comprises a thickness ranged between 2000 angstrom (Å) and 60,000 angstrom (Å).

In an embodiment of the present application, the material of the third insulating layer 80 comprises $SiO_2$, $TiO_2$ or $SiN_x$. If the thickness of the third insulating layer 80 is less than 2000 angstrom (Å), the thinner thickness may weaken the insulating property of the third insulating layer 80. Specifically, the third insulating layer 80 is formed on the etched first inclined surface S1 and the etched second inclined surface S2, and the conformally formed third insulating layer 80 comprises an inclined surface. If the third insulating layer 80 comprises a thickness less than 2000 angstrom (Å), the film may be easily cracked.

In an embodiment of the present application, the material of the third insulating layer 80 comprises $SiO_2$, $TiO_2$ or $SiN_x$. If the thickness of the third insulating layer 80 is thicker than 60000 angstrom (Å), it is getting difficult to perform selective etching on the third insulating layer 80. However, the above embodiments do not exclude other materials having a good covering extensibility material or a high etch selectivity to avoid the problem caused by the thin thickness or the thick thickness of the third insulating layer 80.

The third insulating layer 80 comprises a third insulating side surface 80s which is an inclined surface with respect to a horizontally extending surface of the inner surface 200as, 200bs, the outer surface 204as, 204bs of the first semiconductor layer 201, or the exposed upper surface 10s of the substrate 10 exposed through selective etching. The inclined surface comprises an angle between 10 degrees and 70 degrees with respect to a horizontally extending surface of the inner surface 200as, 200bs, the outer surface 204as, 204bs of the first semiconductor layer 201, or the exposed upper surface 10s of the substrate 10 exposed through selective etching.

If the angle of the third insulating sidewall 80s of the third insulating layer 80 is less than 10 degrees, the thickness of the third insulating layer 80 can be substantially reduced. Therefore, it may be difficult to ensure the insulation properties.

If the angle of the third insulating sidewall 80s of the third insulating layer 80 is greater than 70 degrees, the insulating layer and the metal layer subsequently formed may not completely cover the third insulating layer 80, thereby causing the film cracking.

As shown in FIG. 9 and FIG. 10, the one or the plurality of third insulating layer first openings 801 on the first light-emitting unit 20a is formed corresponding to the one or the plurality of second insulating layer second openings 602a, and overlaps the position of the first insulating layer second opening 502a.

As shown in FIG. 9 and FIG. 10, the one or the plurality of third insulating layer second openings 802 on the second light-emitting unit 20b overlaps with the second opening 502b of the first insulating layer 50 formed below, and the one or the plurality of second openings 802 of the third insulating layer 80 do not overlap with the second opening 602b of the second insulating layer 60.

Figure 11:
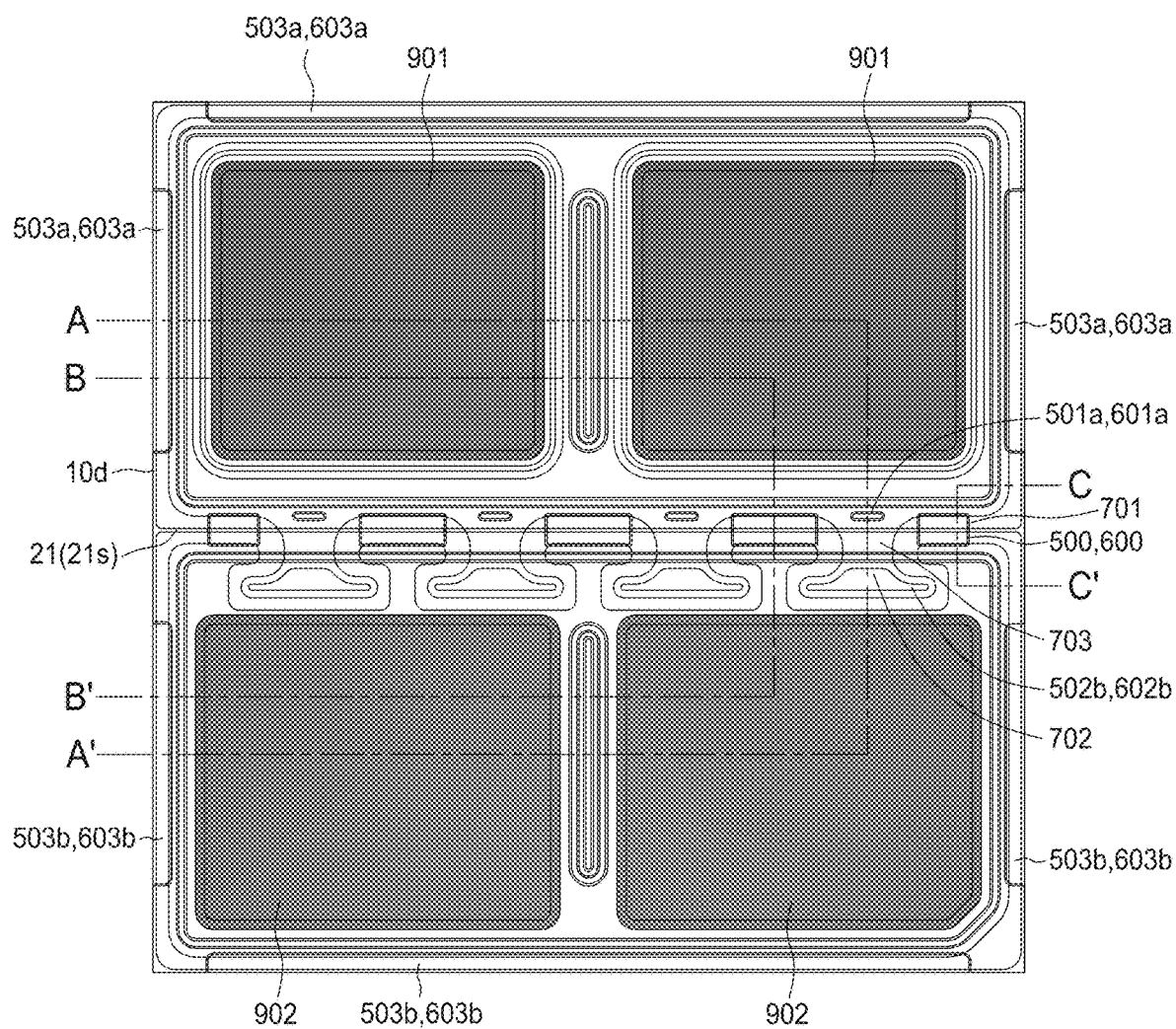
FIG. 11 illustrates a top view showing a first electrode pad and a second electrode pad formed on the semiconductor stack in accordance with an embodiment of the present application.
Figure 12:
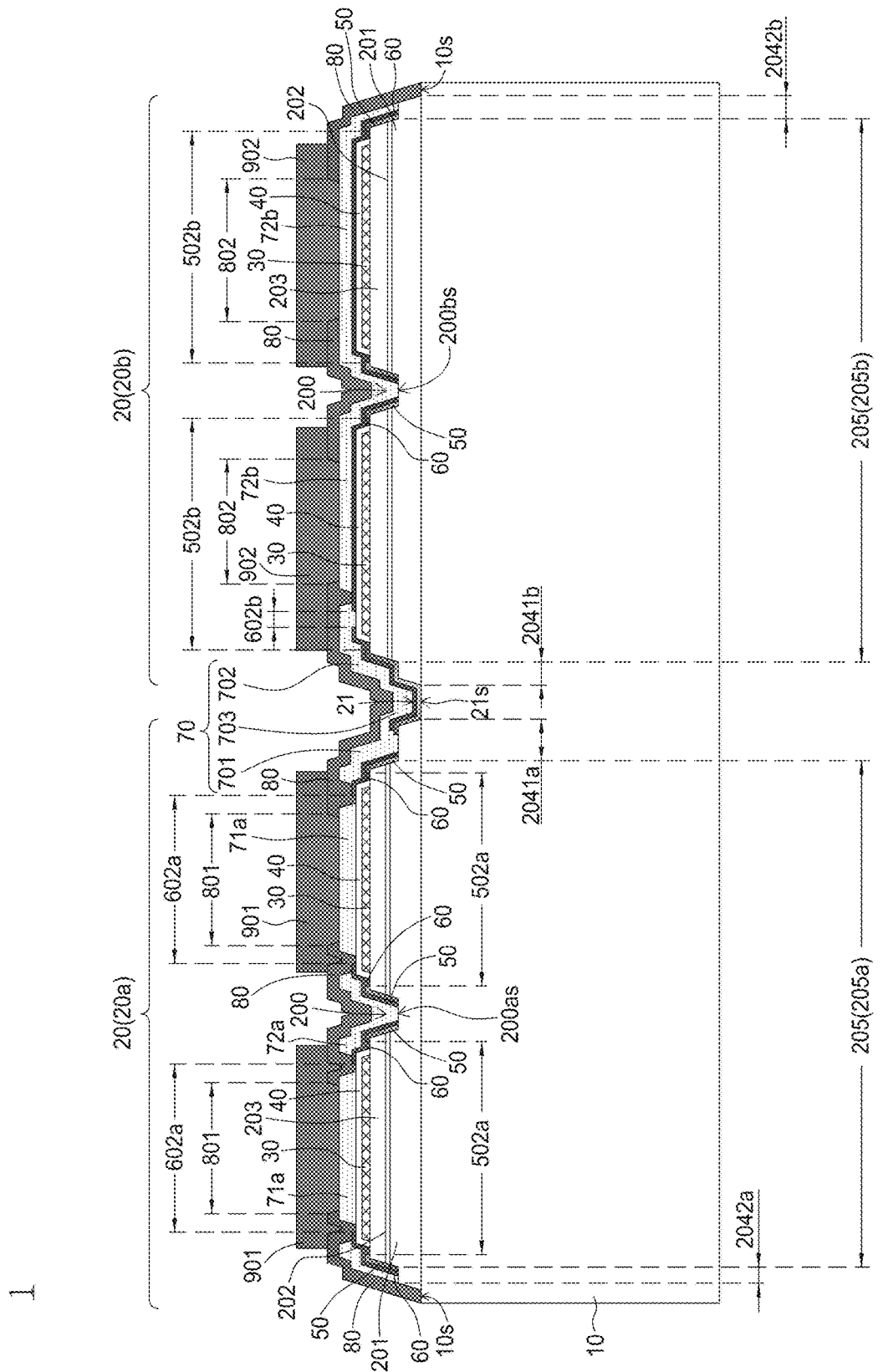
FIG. 12 illustrates a cross-sectional view taken along line A-A' of FIG. 11.
Figure 13:
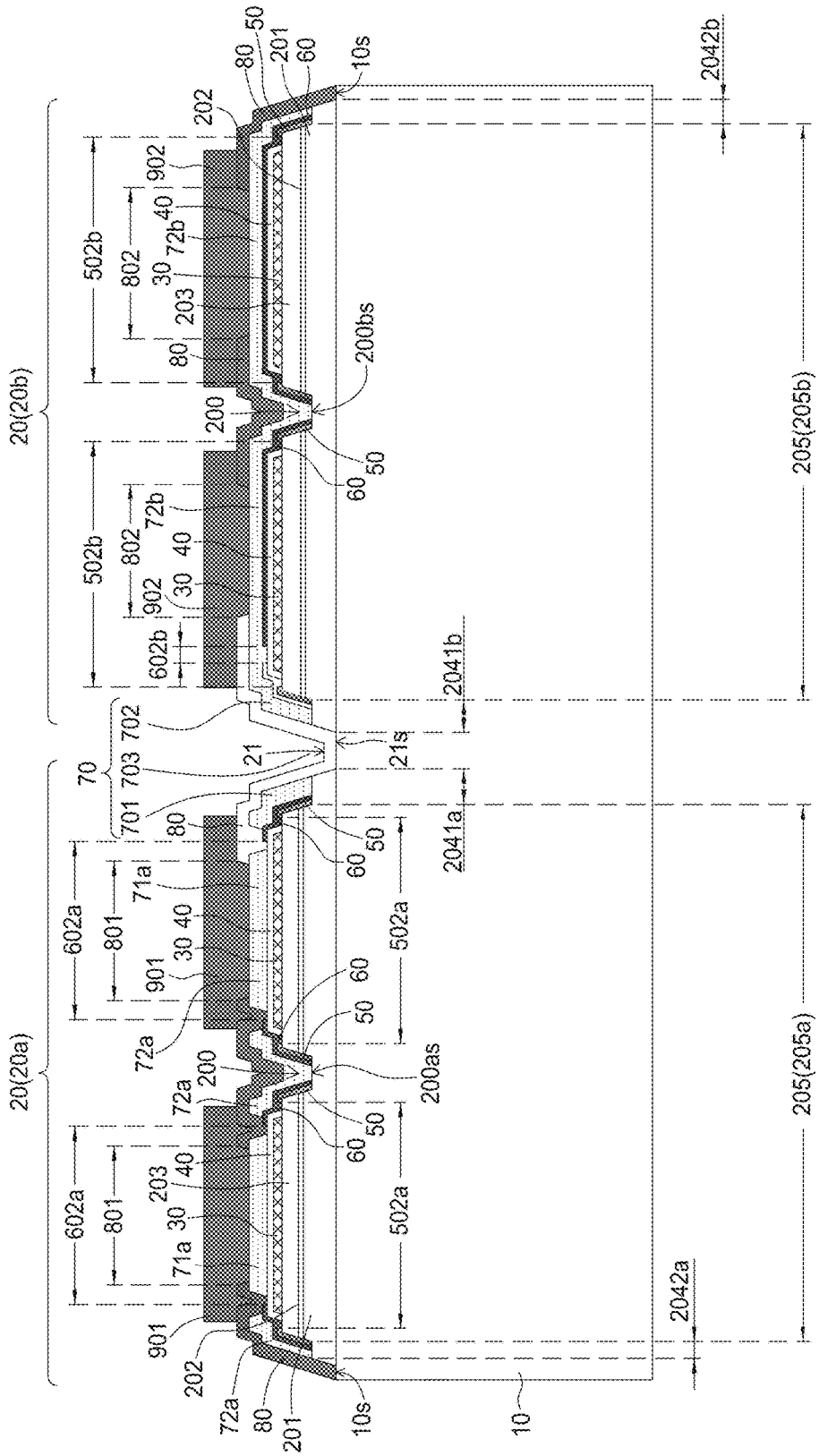
FIG. 13 illustrates a cross-sectional view taken along line B-B' of FIG. 11.
Figure 14:
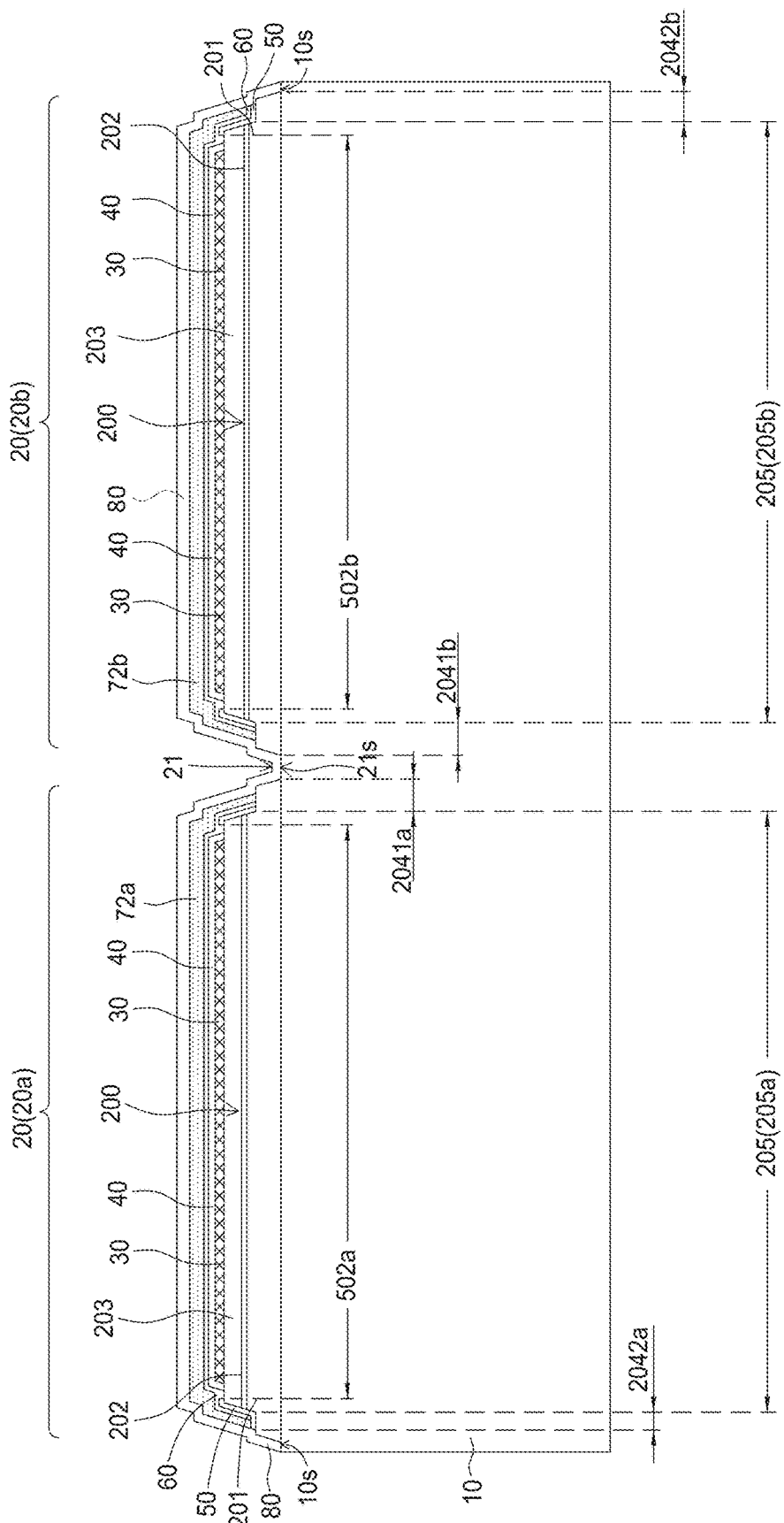
FIG. 14 illustrates a cross-sectional view taken along line C-C' of FIG. 11.

FIG. 11 illustrates a top view of a first electrode pad and a second electrode pad in accordance with an embodiment of the present application. FIG. 12 illustrates a cross-sectional view taken along line A-A' of FIG. 11. FIG. 13 illustrates a cross-sectional view taken along line B-B' of FIG. 11. FIG. 14 illustrates a cross-sectional view taken along line C-C' of FIG. 11. The light-emitting device 1 comprises one or a plurality of first electrode pads 901 covering the one or the plurality of third insulating layer first openings 801 and contacting the one or the plurality of first top electrodes 71a. The first electrode pad 901 is electrically connected to the second semiconductor layer 203 on the first light-emitting unit 20a by the reflective layer 40 and/or the contact electrode 30.

The light-emitting device 1 comprises one or a plurality of second electrode pads 902 covering the one or the plurality of second openings 802 of the third insulating layer 80 and contacting the second bottom electrode 72b. The second electrode pad 902 is electrically connected to the first semiconductor layer 201 on the second light-emitting unit 20b by the second bottom electrode 72b formed on the second via 200b and the second surrounding part 204b.

The electrical current injected through the first electrode pad 901 and the second electrode pad 902 electrically connects the first light-emitting unit 20a and the second light-emitting unit 20b in series by the first connecting part 701 and the second connecting part 702 of the connecting electrode 70.

The upper surface of the first electrode pad 901 or the second electrode pad 902 may be planar or non-planar. When the upper surface of the first electrode pad 901 or the second electrode pad 902 is non-planar, the upper surface of the first electrode pad 901 or the second electrode pad 902 comprises a surface topography corresponding to that of the first opening 801 of the third insulating layer 80 and that of the first opening 802 of the third insulating layer 80, such as an elongated profile, a circular or a stepped profile. As shown in FIG. 11, the upper surface of the first electrode pad 901 or the second electrode pad 902 comprises a recess and a protrusion surrounding the recess. A position of the recess corresponds to a position of the first opening 801 of the third insulating layer 80 or the second opening 802 of the third insulating layer 80, and the recess is formed in the first opening 801 of the third insulating layer 80 and the second opening 802 of the third insulating layer 80. The position of the protrusion is formed at a position other than that of the first opening 801 of the third insulating layer 80 and the second opening 802 of the third insulating layer 80, and the protrusion is formed on the upper surface of the third insulating layer 80. A stepped surface is formed between the protrusion and the recess, wherein the stepped surface comprises a step height between 200 angstrom (Å) and 60,000 angstrom (Å), preferably between 1000 angstrom (Å) and 30,000 angstrom (Å), more preferably between 2000 angstrom (Å) and 20,000 angstrom (Å). The recess and the protrusion comprise a circular shape or a rectangular shape as shown in FIG. 1.

In another embodiment of the present application (not shown), the first electrode pad 901 and the second electrode pad 902 comprises a thin pad structure comprising a thickness smaller than a thickness of the third insulating structure 80. The first electrode pad 901 and the second electrode pad 902 comprise a metal material comprising chromium (Cr), titanium (Ti), tungsten (W), gold (Au), aluminum (Al), indium (In), tin (Sn), nickel (Ni), platinum (Pt) or an alloy of the above materials. The first electrode pad 901 and the second electrode pad 902 comprise single layer or multilayers. For example, the first electrode pad 901 and the second electrode pad 902 comprise Ti/Au stack, Ti/Pt/Au stack, Cr/Au stack, Cr/Pt/Au stack, Ni/Au stack, Ni/Pt/Au stack or Cr/Al/Cr/Ni/Au stack.

In an embodiment of the present application, the first electrode pad 901 comprises a size that is the same as or different from that of the second electrode pad 902, and the size comprises a width or an area. For example, the upper surface area of the first electrode pad 901 or the second electrode pad 902 may be 0.8 times or more and less than 1 time the sum of the upper surface areas of the first electrode pad 901 and the second electrode pad 902.

In an embodiment of the present application (not shown), the first electrode pad 901 or the second electrode pad 902 respectively comprises an inclined sidewall, and cross-sectional area of the first electrode pad 901 or the second electrode pad 902 varies along the thickness direction. For example, a side of the first electrode pad 901 or the second electrode pad 902 away from the semiconductor stack comprises a cross-sectional area smaller than that of a side of the first electrode pad 901 or the second electrode pad 902 near the semiconductor stack.

In an embodiment of the present application (not shown), when the light-emitting device 1 is flipped to be mounted onto the package substrate, in order to increase the contact area between the first electrode pad 901, the second electrode pad 902 and the package substrate, a side of the first electrode pad 901 or the second electrode pad 902 away from the semiconductor stack comprises a cross-sectional area larger than that of a side of the first electrode pad 901 or the second electrode pad 902 near the semiconductor stack.

The first electrode pad 901 or the second electrode pad 902 comprises a thickness between 1 and 100 μm, preferably between 1.5 and 6 μm.

The first electrode pad 901 and the second electrode pad 902 comprise a space formed there between. The space comprises a shortest distance larger than 10 μm and a longest distance less than 250 μm. In the above range, the upper surface areas of the first electrode pad 901 and the second electrode pad 902 is increased by reducing the space between the first electrode pad 901 and the second electrode pad 902, so that the heat dissipation efficiency of the light-emitting device 1 can be improved, and a short circuit between the first electrode pad 901 and the second electrode pad 902 is avoided.

As mentioned above, the light-emitting device 1 comprises the first light-emitting unit 20a and the second light-emitting unit 20b, wherein the first light-emitting unit 20a and the second light-emitting unit 20b are separated by the trench 21. The first surrounding part 204a comprises the first inner recess 2041a and the plurality of first outer recesses 2042a formed on the first light-emitting unit 20a. The second surrounding part 204b comprises the second inner recess 2041b and the plurality of second outer recesses 2042b. The connecting electrode 70 is formed between the first light-emitting unit 20a and the second light-emitting unit 20b.

The connecting electrodes 70 comprises the first connecting part 701 on the first inner recess 2041a of the first light-emitting unit 20a, the second connecting part 702 formed on the second semiconductor layer 203 of the second light-emitting unit 20b, and the third connecting part 703 formed in the trench 21 and between the first connecting part 701 and the second connecting part 702. The first connecting part 701 comprises the first width W1 smaller than second width W2 of the second connecting part 702.

The first top electrodes 71a is formed on the second semiconductor layer 203 on the first light-emitting unit 20a. The first bottom electrode 72a covers the first inner recess 2041a and the plurality of first outer recesses 2042a of the first light-emitting unit 20a. The second bottom electrode 72b covers the second inner recess 2041b of the second light-emitting unit 20b and the plurality of second outer recesses 2042b.

The first electrode pad 901 contacts the first top electrodes 71a and is electrically connected to the second semiconductor layer 203 on the first light-emitting unit 20a. The second electrode pad 902 contacts the second bottom electrode 72b and is electrically connected to the first semiconductor layer 201 on the second light-emitting unit 20b.

Figure 15:
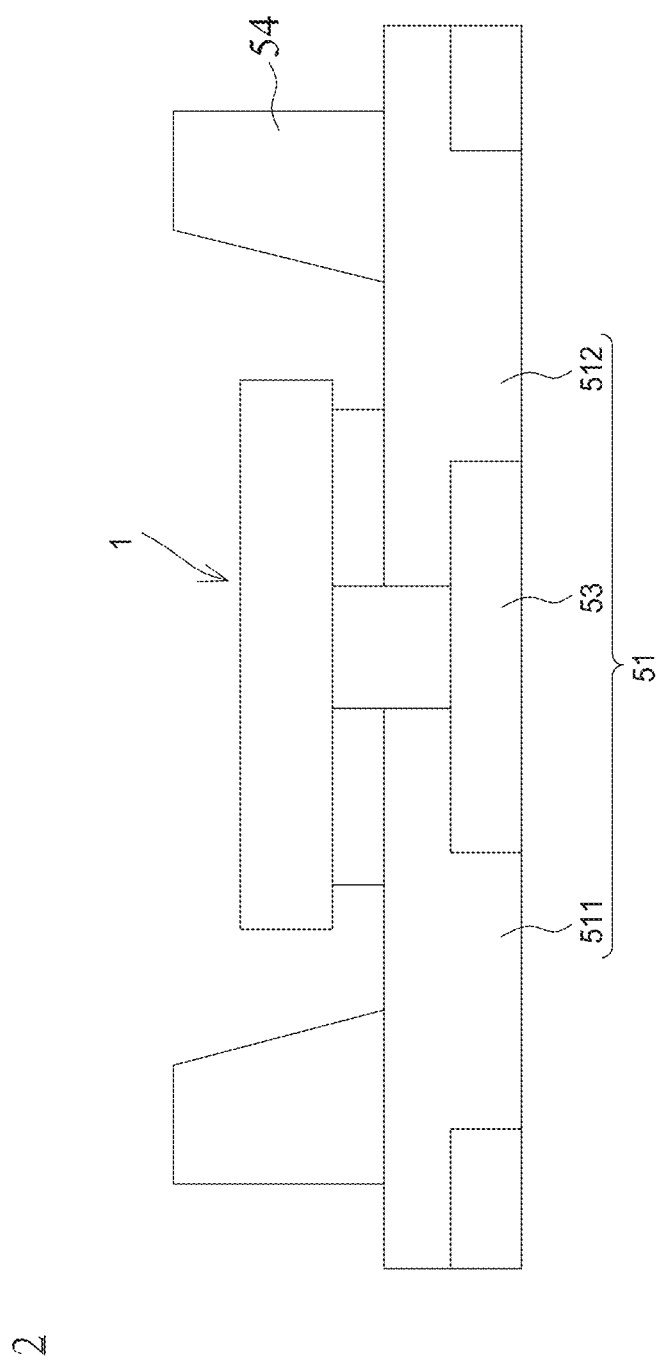
FIG. 15 illustrates a schematic view of a light-emitting apparatus 2 in accordance with an embodiment of the present application.

FIG. 15 is a schematic view of a light-emitting apparatus 2 in accordance with an embodiment of the present application. The light-emitting device 1 in the foregoing embodiment is mounted on the first spacer 511 and the second spacer 512 of the package substrate 51 in the form of flip chip. The first spacer 511 and the second spacer 512 are electrically insulated from each other by an insulating portion 53 comprising an insulating material. The main light-extraction surface of the flip chip is one side of the growth substrate opposite to the electrode-forming surface where the electrodes are formed on. A reflective structure 54 can be provided around the light-emitting device 1 to increase the light extraction efficiency of the light-emitting apparatus 2.

Figure 16:
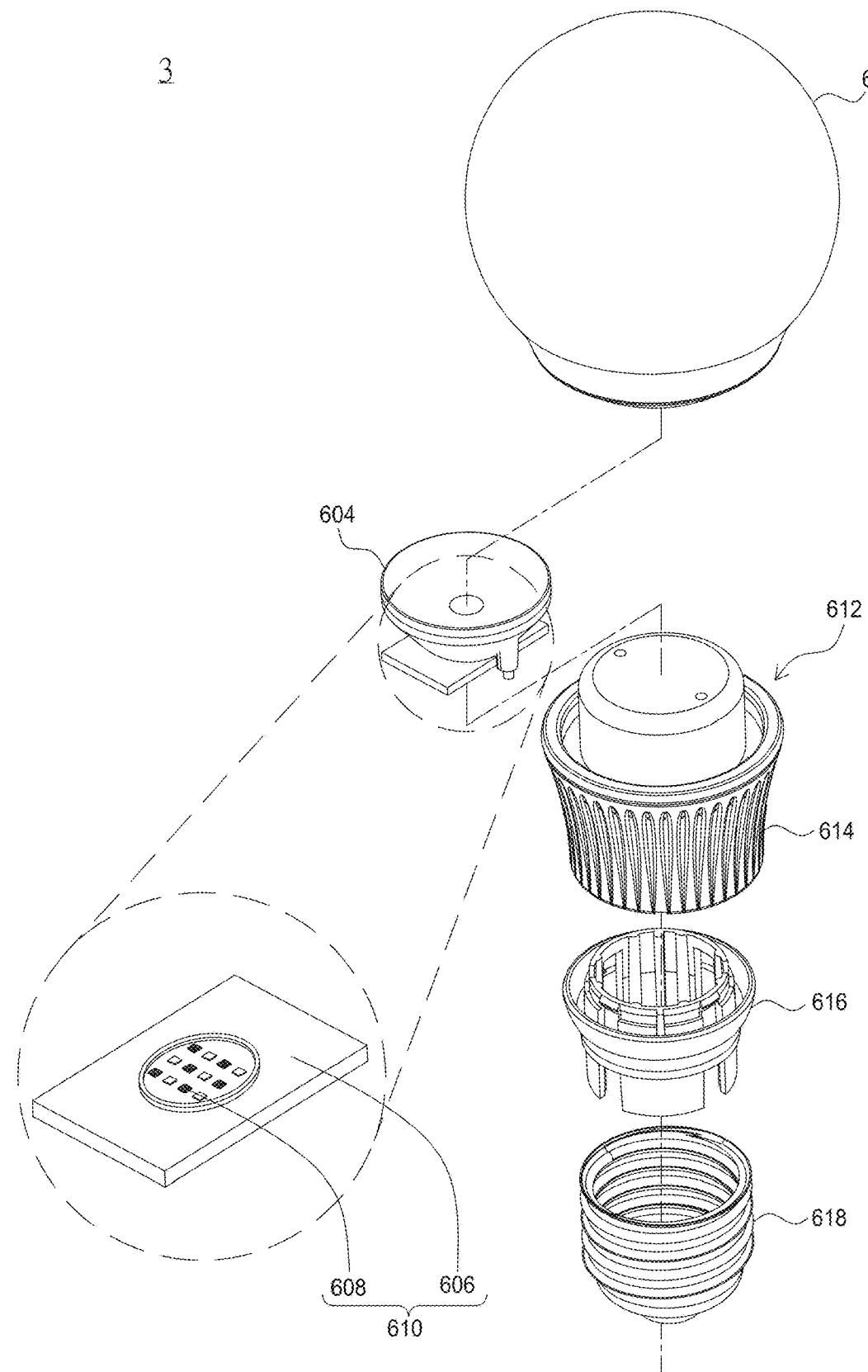
FIG. 16 illustrates a schematic view of a light-emitting apparatus 3 in accordance with an embodiment of the present application.

FIG. 16 illustrates a structure diagram of a light-emitting apparatus 3 in accordance with an embodiment of the present application. A light bulb comprises an envelope 602, a lens 604, a light-emitting module 610, a base 612, a heat sink 614, a connector 616 and an electrical connecting device 618. The light-emitting module 610 comprises a submount 606 and a plurality of light-emitting devices 608 on the submount 606, wherein the plurality of light-emitting devices 608 can be the light-emitting device 1 or the light-emitting apparatus 2 described in above embodiments.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A light-emitting device, comprising:
   a substrate;
   a first light-emitting unit and a second light-emitting unit on the substrate, each of the first light-emitting unit and the second light-emitting unit comprises a first semiconductor layer, a second semiconductor layer, and an active layer between the first semiconductor layer and the second semiconductor layer, wherein the first light-emitting unit comprises a first surrounding part exposing the first semiconductor layer of the first light-emitting unit, and the second light-emitting unit comprises a second surrounding part exposing the first semiconductor layer of the second light-emitting unit;
   a trench formed between the first light-emitting unit and the second light-emitting unit to expose the substrate;
   a second insulating layer comprising a first opening on the first surrounding part of the first light-emitting unit and a second opening on the second semiconductor layer of the second light-emitting unit, wherein the second opening of the second insulating layer comprises a first opening area larger than a second opening area of the first opening of the second insulating layer; and
   one or a plurality of connecting electrodes each comprising a first connecting part formed on the first light-emitting unit and electrically connected to the first semiconductor layer through the first opening of the second insulating layer, a second connecting part formed on the second light-emitting unit and electrically connected to the second semiconductor layer of the second light-emitting unit through the second opening of the second insulating layer, and a third connecting part formed in the trench to connect the first connecting part and the second connecting part.

2. The light-emitting device according to claim 1, further comprising a first top electrode formed on the second semiconductor layer of the first light-emitting unit, and a first bottom electrode formed on the first surrounding part of the first light-emitting unit, wherein the first top electrode is surrounded by the first bottom electrode in a top view of the light-emitting device.

3. The light-emitting device according to claim 1, further comprising a second bottom electrode formed on the second semiconductor layer of the second light-emitting unit, wherein the second bottom electrode contacts the first semiconductor layer exposed on the second surrounding part of the second light-emitting unit.

4. The light-emitting device according to claim 3, wherein the second bottom electrode comprises a plurality of second bottom electrode protrusions formed on the second surrounding part, wherein the plurality of connecting electrodes and the plurality of second bottom electrode projecting portions are alternately arranged.

5. The light-emitting device according to claim 1, further comprising a first bottom electrode formed on the first surrounding part to electrically connect the first semiconductor layer of the first light-emitting unit and a second bottom electrode formed on the second semiconductor layer of the second light-emitting unit to electrically connect the first semiconductor layer of the second light-emitting unit, wherein the second bottom electrode comprises a surface area larger than that of the first bottom electrode.

6. The light-emitting device according to claim 4, wherein the second surrounding part comprises a second inner recess and a plurality of second outer recesses, and the plurality of second bottom electrode protrusions is formed in the second inner recess of the second surrounding part.

7. The light-emitting device according to claim 6, wherein the second insulating layer comprises a plurality of third openings formed on the plurality of second outer recesses of the second surrounding part and the second bottom electrode is electrically connected to the first semiconductor layer through the plurality of third openings.

8. The light-emitting device according to claim 1, further comprising a first top electrode formed on the second semiconductor layer of the first light-emitting unit to electrically connect the second semiconductor layer of the first light-emitting unit and a second bottom electrode formed on the second semiconductor layer of the second light-emitting unit to electrically connect the first semiconductor layer of the second light-emitting unit.

9. The light-emitting device according to claim 8, further comprising a third insulating layer comprising one or a plurality of first openings of the third insulating layer to expose the first top electrode and one or a plurality of second openings of the third insulating layer to expose the second bottom electrode.

10. The light-emitting device according to claim 9, further comprising one or a plurality of first electrode pads respectively formed on the one or the plurality of first openings of the third insulating layer and contacting the first top electrode, and one or a plurality of second electrode pads respectively formed on the one or the plurality of second openings of the third insulating layer and contacting the second bottom electrode.

11. The light-emitting device according to claim 3, wherein the second bottom electrode comprises a second bottom electrode recess to accommodate the second connecting part.

12. The light-emitting device according to claim 11, wherein the second bottom electrode comprises a second bottom electrode protrusion being adjacent to the second bottom electrode recess and comprising a width smaller than that of the second connecting part.

13. The light-emitting device according to claim 11, wherein the second bottom electrode comprises a second bottom electrode protrusion being adjacent to the second bottom electrode recess and comprising a width larger than that of the second connection part.

14. The light-emitting device according to claim 1, wherein in a top view of the light-emitting device, the second connecting part comprises a width larger than a width of the first connecting part.

15. The light-emitting device according to claim 1, wherein in the top view of the light-emitting device, the first connecting part comprises a width larger than that of the third connecting part.

16. The light-emitting device according to claim 1, wherein the first light-emitting unit comprises a first semiconductor mesa continuously surrounded by the first surrounding part and the second light-emitting unit comprises a second semiconductor mesa continuously surrounded by the second surrounding part.

17. The light-emitting device according to claim 16, wherein the first semiconductor mesa and the second semiconductor mesa each comprises the first semiconductor layer, the second semiconductor layer, and the active layer, and the first surrounding part and the second surrounding part each exposes the first semiconductor layer.

18. The light-emitting device according to claim 17, wherein the first semiconductor mesa or the second semiconductor mesa comprises a wave shape, a zigzag shape or a square wave shape.

19. The light-emitting device according to claim 1, further comprising one or a plurality of vias located inside the first light-emitting unit or the second light-emitting unit, wherein the one or the plurality of vias exposes the first semiconductor layer of the first light-emitting unit or the second light-emitting unit.

20. The light-emitting device according to claim 1, further comprising a dicing street surrounding the first light-emitting unit and the second light-emitting unit, wherein he dicing street exposes the substrate.

* * * * *